(12) United States Patent
Tsukizawa et al.

(10) Patent No.: US 7,170,358 B2
(45) Date of Patent: Jan. 30, 2007

(54) VOLTAGE CONTROLLED OSCILLATOR, AND PLL CIRCUIT AND WIRELESS COMMUNICATION APPARATUS USING THE SAME

(75) Inventors: Takayuki Tsukizawa, Katano (JP); Koji Takinami, Osaka (JP); Atsushi Ohara, Otsu (JP); Hisashi Adachi, Mino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 84 days.

(21) Appl. No.: 11/150,151

(22) Filed: Jun. 13, 2005

(65) Prior Publication Data

US 2005/0275478 A1    Dec. 15, 2005

(30) Foreign Application Priority Data

Jun. 15, 2004    (JP)    ............................. 2004-177262

(51) Int. Cl.
  *H03B 5/12* (2006.01)
  *H03L 7/099* (2006.01)
(52) U.S. Cl. ............................ 331/177 V; 331/36 C; 331/117 FE; 331/179
(58) Field of Classification Search ............. 331/1 A, 331/8, 16–18, 25, 36 C, 117 R, 117 FE, 117 D, 331/177 R, 177 V, 179
See application file for complete search history.

(56) References Cited

U.S. PATENT DOCUMENTS 6,879,218 B2 *    4/2005    Fujita ........................ 331/23

FOREIGN PATENT DOCUMENTS

| JP | 2003-174320 | 6/2003 |
|----|-------------|--------|
| JP | 2003-324316 | 11/2003 |
| JP | 2004-15387 | 1/2004 |
| JP | 2004-147310 | 5/2004 |

OTHER PUBLICATIONS

Koji Takinami et al., "A Wide Tuning Range LC-VCO for 5GHZ Wireless Lan Using a Tuning Sensitivity Linearization Technique", 2003 Asia-Pacific Microwave Conference.

* cited by examiner

*Primary Examiner*—David Mis
(74) *Attorney, Agent, or Firm*—Wenderoth, Lind, & Ponack, L.L.P.

(57) ABSTRACT

A voltage controlled oscillator comprises a parallel resonance circuit including an inductor circuit, a variable capacitance circuit, and a high-frequency switch circuit, a negative resistance circuit and a frequency control section, and a frequency tuning sensitivity control section. The frequency control section shifts a band of an oscillation frequency by controlling ON/OFF of a switching element included in the high-frequency switch circuit. The frequency tuning sensitivity control section adjusts a change rate of a total capacitance of the variable capacitance circuit with respect to a control voltage, depending on a band to be used. The frequency tuning sensitivity control section is connected to a virtual ground point of a differential signal.

25 Claims, 14 Drawing Sheets

| | A | B | C | D | E |
|---|---|---|---|---|---|
| BAND0 | O | × | × | × | × |
| BAND1 | O | × | × | × | × |
| BAND2 | O | × | × | × | × |
| BAND3 | O | O | × | × | × |
| BAND4 | O | O | × | × | × |
| BAND5 | O | O | × | × | × |
| BAND6 | O | O | O | × | × |
| BAND7 | O | O | O | × | × |
| BAND8 | O | O | O | × | × |
| BAND9 | O | O | O | O | × |
| BAND10 | O | O | O | O | × |
| BAND11 | O | O | O | O | × |
| BAND12 | O | O | O | O | × |
| BAND13 | O | O | O | O | O |
| BAND14 | O | O | O | O | O |
| BAND15 | O | O | O | O | O |

O : USED AS VARIABLE CAPACITANC
× : USED AS FIXED CAPACITANCE

VOLTAGE CONTROLLED OSCILLATOR, AND PLL CIRCUIT AND WIRELESS COMMUNICATION APPARATUS USING THE SAME

BACKGROUND OF THE INVENTION

1. Field of the Invention

The present invention relates to a voltage controlled oscillator, and a PLL circuit and a wireless communication apparatus which employ the same. More particularly, the present invention relates to a voltage controlled oscillator having a band switching function, and a PLL circuit and a wireless communication apparatus which employ the same.

2. Description of the Background Art

Voltage control oscillators are widely used as means for generating a local oscillation signal for wireless communication apparatuses. The voltage controlled oscillator, when manufactured as a high-frequency IC, requires a wide oscillation frequency range to tolerate variations in the components caused by the semiconductor manufacturing process. Recently, there is a demand for a voltage controlled oscillator which has an oscillation frequency variable over a wide frequency range in order to support a communication system which employs different frequency bands.

FIG. 13 is a diagram illustrating an exemplary structure of a conventional voltage controlled oscillator 500 having a band switching function. In FIG. 13, the conventional voltage controlled oscillator 500 includes inductors 501, 502, a power source terminal 503, variable capacitance elements 504, 505, a control voltage terminal 506, oscillation transistors 507, 508, a current source 509, capacitive elements 511, 512, switching elements 513, 514, and a control voltage terminal 515. In FIG. 13, a bias circuit and the like are not illustrated.

Hereinafter, an operation of the conventional voltage controlled oscillator will be described with reference to FIG. 13. In the voltage controlled oscillator 500 of FIG. 13, the inductors 501, 502 are connected in series, and the power source terminal 503 for supplying a power source Vdd is connected between the inductor 501 and the inductor 502. The inductors 501, 502 and the power source terminal 503 constitute an inductor circuit 520. The control voltage terminal 506 is connected to a connection point of the variable capacitance element 504 and the variable capacitance element 505. The variable capacitance elements 504, 505 and the control voltage terminal 506 constitute a variable capacitance circuit 530. The two oscillation transistors 507, 508 are cross-coupled, constituting a negative resistance circuit 540. The capacitive elements 511, 512 and the switching elements 513, 514 constitute a high-frequency switch circuit (band switching circuit) 510. The control voltage terminal 515 is connected to a connection point of the switching element 513 and the switching element 514 to supply a control voltage to the switching elements 513, 514.

The sources of the oscillation transistors 507, 508 are connected to each other and are also connected to one terminal of the current source 509. The other terminal of the current source 509 is grounded. One terminal of each of the switching elements 513, 514 is connected to the capacitive element 511, 512, respectively, another terminal thereof is grounded, and still another terminal thereof is connected to the control voltage terminal 515.

The power source Vdd is supplied from the power source terminal 503 via the inductors 501, 502 to the oscillation transistors 507, 508, respectively. An output of one of the oscillation transistors 507, 508 is fed back to the gate of the other transistor. Thereby, the oscillation circuit oscillates in the vicinity of a resonance frequency which is determined by a parallel resonance circuit composed of the inductor circuit 520, the variable capacitance circuit 530, and the high-frequency switch circuit 510. Specifically, a differential voltage between a control voltage Vt input from the control voltage terminal 506 and the power source Vdd is applied across each of the variable capacitance elements 504, 505. The variable capacitance elements 504, 505 have a capacitance which is determined, depending on the differential voltage. Therefore, the oscillation frequency varies, depending on the control voltage Vt input from the control voltage terminal 506. The switching elements 513, 514 are switched ON/OFF, depending on a control voltage Vctrl input from the control voltage terminal 515, so that a capacitance value of the whole band switching circuit 510 is determined. Therefore, by switching ON/OFF the switching elements 513, 514, the oscillation frequency can be shifted.

FIG. 14A is a diagram illustrating how the oscillation frequency is shifted in the conventional voltage controlled oscillator. Typically, the conventional voltage controlled oscillator employs a plurality of high-frequency switch circuits in order to obtain a wide range in which the oscillation frequency varies. In FIG. 14A, there are nine bands. Thus, in the voltage controlled oscillator 500 of FIG. 13, the oscillation frequency can be continuously changed by controlling the control voltage Vt, and in addition, the oscillation frequency band can be changed by controlling the control voltage Vctrl.

The voltage controlled oscillator 500 of FIG. 13 has an oscillation frequency of f0 represented by:

$$f0 = 1/(2\pi(2L \cdot C'/2)^{1/2}) = 1/(2\pi(L \cdot C')^{1/2}), \text{ and}$$

$$C' = C1 + C2 + C3$$

where L represents an inductance of each of the inductors 501, 502, C1 represents a capacitance value of each of the variable capacitance elements 504, 505, C2 represents a capacitance value of each of the capacitive elements 511, 512 of the high-frequency switch circuit, and C3 represents the remaining differential parasitic capacitance component.

When switched OFF, the switching elements 513, 514 are interrupted, and therefore, the capacitive elements 511, 512 are not connected to the resonant circuit with respect to a high frequency signal. Therefore, in this case, the oscillation frequency f0_off is represented by:

$$f0\_off = 1/(2\pi(L \cdot (C1+C3))^{1/2}).$$

On the other hand, when switched ON, the switching elements 513, 514 are brought into conduction, and therefore, the capacitive elements 511, 512 are connected to the resonant circuit with respect to a high-frequency signal. Therefore, in this case, the oscillation frequency f0_on is represented by:

$$f0\_on = 1/(2\pi(L \cdot (C1+C2+C3))^{1/2}).$$

As used herein, the term "frequency tuning sensitivity" refers to a ratio of a change in the oscillation frequency to the control voltage Vt. The frequency tuning sensitivity is determined based on a ratio of a change amount in capacitance of the variable capacitance circuit to the total capacitance value of the resonant circuit. The frequency tuning sensitivity is increased with an increase in this ratio. f0_off has a higher frequency tuning sensitivity than that of f0_on.

Thus, a higher oscillation frequency and a higher frequency tuning sensitivity are obtained when the switching elements 513, 514 are switched OFF.

As illustrated in FIG. 14A, as the number of bands is increased by using an increased number of switching elements in the high-frequency switch circuit, a difference in frequency tuning sensitivity between the highest oscillation frequency band and the lowest oscillation frequency band increases.

However, a relationship between the control voltage Vt and the oscillation frequency of the voltage controlled oscillator is preferable when all of the bands, i.e., all of the oscillation frequencies have substantially the same slope. This is because, when the voltage controlled oscillator is used to construct a phase lock loop (PLL) circuit, transient response characteristics or noise-band characteristics of of the PLL circuit depends on the frequency tuning sensitivity with respect to the control voltage, and therefore, when the frequency tuning sensitivity varies depending on the frequency, characteristics of the PLL circuit itself varies depending on the frequency.

When the voltage controlled oscillator is implemented on a semiconductor substrate, the oscillation frequency also needs to be variable over a wide frequency range. In the conventional voltage controlled oscillator 500 of FIG. 13, a high-frequency switch circuit can be used to obtain a wide range of variable frequency. However, it is difficult to obtain substantially the same frequency tuning sensitivity over the entire wide variable-frequency range.

To solve the above-described problems, some circuits have already been proposed (see, for example, Japanese Patent Laid-Open Publication Nos. 2003-174320 and 2004-15387).

FIG. 15 is a circuit diagram illustrating a conventional voltage controlled oscillator 600 which employs an improved method of obtaining substantially the same frequency tuning sensitivity over a wide range of variable frequency.

In FIG. 15, parts having a function similar to that of the conventional voltage controlled oscillator 500 of FIG. 13 are referenced with the same reference numerals and will not be explained. In FIG. 15, the conventional voltage controlled oscillator 600 is different from the conventional voltage controlled oscillator 500 in that the conventional voltage controlled oscillator 600 includes variable capacitance elements 551, 552, 561, 562, 571, 572 and switching elements 553, 554, 563, 564, 573, 574.

In the voltage controlled oscillator 600 of FIG. 15, first, second and third variable capacitance circuits 550, 560, 570 are connected in parallel. In the first variable capacitance circuit 550, switching elements 553, 554 are connected to opposite ends of series-connected variable capacitance elements 551, 552. In the second variable capacitance circuit 560, switching elements 563, 564 are connected to opposite ends of series-connected variable capacitance elements 561, 562. In the third variable capacitance circuit 570, switching elements 573, 574 are connected to opposite ends of series-connected variable capacitance elements 571, 572. The first, second and third variable capacitance circuits 550, 560, 570 receive a control voltage Vt through a control voltage terminal 506.

As the oscillation frequency is lowered, a ratio of the capacitance change amount of the variable capacitance circuit to the total capacitance value of the resonant circuit is decreased, resulting in a decrease in the frequency tuning sensitivity. Therefore, for a band having a lower oscillation frequency, by increasing the number of variable capacitance circuits connected to the resonant circuit by switching ON the switching elements in the variable capacitance circuits to increase the change amounts in capacitance of the variable capacitance elements as described below, the frequency tuning sensitivity can be caused to be substantially the same as when the oscillation frequency is high.

For example, to provide a band having the highest oscillation frequency of FIG. 14A, the switching elements 553, 554 of only the first variable capacitance circuit 550 among the first to third variable capacitance circuits 550, 560, 570 are switched ON while the others are switched OFF. Also, for example, to provide a band having the fifth oscillation frequency counted from the top in FIG. 14A, the switching elements 553, 554, 563, 564 of the first and second variable capacitance circuits 550, 560 among the first to third variable capacitance circuits 550, 560, 570 are switched ON while the others are switched OFF. Also, for example, to provide a band having the lowest oscillation frequency of FIG. 14A, the switching elements 553, 554, 563, 564, 573, 574 of all of the first to third variable capacitance circuits 550, 560, 570 are switched ON. Thus, as the oscillation frequency is decreased, the number of variable capacitance circuits connected in parallel in the resonant circuit is increased, thereby increasing a change amount in the capacitance. As a result, it is possible to obtain substantially the same frequency tuning sensitivity over the entire oscillation frequency range. FIG. 14B is a diagram illustrating characteristics of the voltage controlled oscillator 600 when substantially the same frequency tuning sensitivity is obtained over the entire oscillation frequency range.

However, in the conventional improved method of FIG. 15, the switching elements 553, 554, 563, 564, 573, 574 are provided in portions of the variable capacitance circuits 550, 560, 570 through which a high-frequency signal flows, and therefore, phase noise characteristics are deteriorated due to loss in the switching elements. For example, when the switching element is a MOS switch, loss occurs in the on-resistance, resulting in a deterioration in the phase noise characteristics.

Japanese Patent Laid-Open Publication No. 2003-324316 discloses a voltage controlled oscillator for use in prevention of deterioration of the phase noise characteristics. FIG. 16A is a circuit diagram illustrating a conventional voltage controlled oscillator 700 described in the document. FIG. 16B is a graph illustrating characteristics of the conventional voltage controlled oscillator 700 of the document. In the conventional voltage controlled oscillator 700, variable capacitance elements and an inductor 707 are connected in parallel. The conventional voltage controlled oscillator 700 switches ON/OFF switching elements 708 to 711, thereby changing the number of variable capacitance elements. As a result, the capacitance of an LC oscillator is changed, thereby changing oscillation frequency bands. In FIG. 16B, A indicates characteristics when a control voltage CTRL is applied only to a middle point between the variable capacitance elements 701 and 702 while Vss is applied to a middle point between the variable capacitance elements 703 and 704 and a middle point between the variable capacitance elements 705 and 706; B indicates characteristics when only one of the switching elements 708 and 710 is switched ON; and C indicates characteristics when both the switching elements 708 and 710 are switched ON. For the band A, although the total capacitance of the resonant circuit is largest (the lowest oscillation frequency), the ratio of the capacitance change amount of the variable capacitance circuit to the total capacitance is small. Therefore, the frequency tuning sensitivity is lowest for the band A. Thus, the frequency tuning sensitivity varies from band to band.

SUMMARY OF THE INVENTION

Therefore, an object of the present invention is to provide a voltage controlled oscillator which can suppress a deterioration in phase noise characteristics and control a range of variable frequency over a wide band to obtain substantially the same frequency tuning sensitivity over the variable-frequency range, and a PLL circuit and a wireless communication apparatus using the same.

The present invention has the following features to attain the object mentioned above. A first aspect of the present invention is directed to a voltage controlled oscillator composed of a differential circuit for oscillating a high-frequency signal, comprising an inductor circuit having an inductor, n (n is a natural number of 2 or more) variable capacitance circuits connected in parallel with the inductor circuit, each having a variable capacitance element whose capacitance value is changed, depending on a control voltage applied, so as to feedback control an oscillation frequency, m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input, a negative resistance circuit connected in parallel with the inductor circuit, a frequency control section of controlling ON/OFF of the switching elements of the m high-frequency switch circuits to shift a band of the oscillation frequency, and a frequency tuning sensitivity control section of adjusting a change rate of a total capacitance of the n variable capacitance circuits with respect to the control voltage, depending on the band to be used. The frequency tuning sensitivity control section is connected to virtual ground points of differential signals of the n variable capacitance circuits.

According to the first aspect of the present invention, the voltage controlled oscillator can switch oscillation frequency bands using the high-frequency switch circuit so that a voltage controlled oscillator having a wide range of variable frequency is provided. Further, the capacitance change rate is adjusted, depending on a band to be used, thereby making it possible to obtain substantially the same frequency tuning sensitivity over the variable-frequency range. Furthermore, the frequency tuning sensitivity control section is connected to the virtual ground point, so that a high-frequency signal does not flow out from the voltage controlled oscillator. As a result, loss does not occur in the frequency tuning sensitivity control section, where by the Q factor is not deteriorated. Therefore, the phase noise characteristics are suppressed from deterioration.

For example, the frequency control section may input the switching control voltage for controlling ON/OFF of the switching element, depending on the band to be used, to the switching control terminal of the high-frequency switch circuit, and the frequency tuning sensitivity control section may selectively switch a predetermined reference voltage and the control voltage in synchronization with the switching control voltage so that the selected predetermined reference voltage or control voltage is used as a voltage to be applied to one end of each variable capacitance element of the n variable capacitance circuits.

Thereby, a variable capacitance circuit which functions as a fixed capacitance to which a reference voltage is input, and a variable capacitance circuit which functions as a variable capacitance to which a control voltage is input, are determined, depending on a band to be used. By adjusting the number of variable capacitance circuits which function as variable capacitances, it is possible to adjust the capacitance change rate with respect to the control voltage, thereby making it possible to obtain substantially the same frequency tuning sensitivity over a variable-frequency range.

For example, the frequency tuning sensitivity control section may include n frequency tuning sensitivity control switching elements, and the frequency tuning sensitivity control switching elements may be connected to the respective virtual ground points of the n variable capacitance circuits and may be selectively switched to determine whether the voltages to be applied to the respective variable capacitance circuits are the predetermined reference voltage or the control voltage.

Thus, the frequency tuning sensitivity control switching element connected to the virtual ground point can be used to efficiently switch the reference voltage and the control voltage and suppress phase noise.

For example, the frequency tuning sensitivity control section may include n−1 frequency tuning sensitivity control switching elements, the frequency tuning sensitivity control switching elements may be connected to the respective virtual ground points of the n−1 variable capacitance circuits and may be selectively switched to determine whether the voltages to be applied to the respective variable capacitance circuits are the predetermined reference voltage or the control voltage, and the control voltage may be supplied to a virtual ground point of the remaining one of the variable capacitance circuits.

Thereby, at least one of the variable capacitance circuits necessarily functions as a variable capacitance.

For example, the reference voltage may be a voltage at a middle point of a range in which the control voltage varies.

Thereby, the voltage controlled oscillator can obtain substantially the same frequency tuning sensitivity, where the middle point of the range of the variable control voltage is a center.

For example, the reference voltage may have a value of the control voltage when the oscillation frequency is feedback-controlled so that the oscillation frequency is locked.

Thereby, a total capacitance value of the resonant circuit is not changed before and after the number of variable capacitance circuits functioning as variable capacitances is changed. Therefore, even when a feedback control is converged, an output frequency is not changed. Therefore, the voltage controlled oscillator can obtain substantially the same frequency tuning sensitivity over the variable-frequency range while outputting a desired frequency.

For example, when all of the switching elements of the m high-frequency switch circuits are OFF, the frequency tuning sensitivity control section may control the frequency tuning sensitivity control switching element so that the control voltage is applied to only one of the n variable capacitance circuits and the reference voltage is applied to the remaining n−1 variable capacitance circuits.

Thereby, at least one of the variable capacitance circuits functions as a variable capacitance.

For example, when all of the switching elements of the m high-frequency switch circuits are ON, the frequency tuning sensitivity control section may control the frequency tuning sensitivity control switching element so that the control voltage is applied to all of the n variable capacitance circuits.

Thereby, when all of the switching elements of the high-frequency switch circuit are ON, a variable capacitance circuit functioning as a fixed capacitance is not required, whereby the circuit scale of the voltage controlled oscillator is reduced.

For example, the frequency tuning sensitivity control section may previously determine whether each of the variable capacitance circuits is used as a variable capacitance or a fixed capacitance for each of the bands to be shifted by the frequency control section, and input the control signal to the variable capacitance circuit used as the variable capacitance, and a predetermined reference voltage to the variable capacitance circuit used as the fixed capacitance.

Thereby, a variable capacitance circuit to which the reference voltage is input and which functions as a fixed capacitance and a variable capacitance circuit to which the control voltage is input and which functions as a variable capacitance, are determined, depending on a band to be used. By adjusting the number of variable capacitance circuits which function as variable capacitances, it is possible to adjust the capacitance change rate with respect to the control voltage, thereby making it possible to obtain substantially the same frequency tuning sensitivity over a variable-frequency range.

Preferably, the voltage controlled oscillator may be provided in a PLL circuit. A control voltage when the PLL circuit is locked may be used as a predetermined reference voltage.

Thereby, a total capacitance value of the resonant circuit is not changed before and after the number of variable capacitance circuits functioning as variable capacitances is changed. Therefore, even when the PLL circuit is locked, a frequency output from the PLL circuit is not changed. Therefore, the voltage controlled oscillator can obtain substantially the same frequency tuning sensitivity over the variable-frequency range while outputting a desired frequency.

A second aspect of the present invention is directed to A voltage controlled oscillator composed of a differential circuit for oscillating a high-frequency signal, comprising an inductor circuit having an inductor, n (n is a natural number of 2 or more) variable capacitance circuits connected in parallel with the inductor circuit, each having a variable capacitance element, wherein a blocking capacitor for blocking a direct current component is provided on opposite ends of each of the n variable capacitance circuits, m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input, a negative resistance circuit connected in parallel with the inductor circuit, a frequency control section of controlling ON/OFF of the switching elements of the m high-frequency switch circuits to shift a band of the oscillation frequency, a control terminal of inputting a control voltage for feedback-controlling an oscillation frequency to one terminals of the variable capacitance elements of the n variable capacitance circuits, and a reference voltage control section of inputting reference voltages to the other terminals of the variable capacitance elements of the n variable capacitance circuits, adjusting the reference voltages, depending on the band to be used, and adjusting a rate of a change in the oscillation frequency with respect to the control voltage.

According to the second aspect of the present invention, it is possible to obtain substantially the same frequency tuning sensitivity over a variable-frequency range by adjusting the reference voltage, depending on a band to be used.

For example, the reference voltage control section may control the reference voltages to be input to the other terminals of the variable capacitance elements of the n variable capacitance circuits in synchronization with the switching control voltage input to the switching control terminal of the high-frequency switch circuit.

Thereby, it is possible to change a capacitance of the variable capacitance circuit.

For example, the reference voltage control section may use the $(n+1)/2$-th reference voltage of the reference voltages input to the other terminals of the variable capacitance elements of the n variable capacitance circuits as a voltage at a middle point of a range within which the control voltage varies when n is an odd number, and use an intermediate voltage between the $n/2$-th reference voltage and the $(n+2)/2$-th reference voltage as the voltage at the middle point of the range within which the control voltage varies when n is an even number.

Thereby, it is possible to obtain substantially the same frequency tuning sensitivity over a variable-capacitance range in the vicinity of the reference voltage.

For example, when n is an odd number, the reference voltage control section may use the $(n+1)/2$-th reference voltage of the reference voltages input to the other terminals of the variable capacitance elements of the n variable capacitance circuits as a control voltage obtained when the oscillation frequency is locked by feedback-controlling the oscillation frequency; and when n is an even number, may use an intermediate voltage between the $n/2$-th reference voltage and the $(n+2)/2$-th reference voltage as the control voltage obtained when the oscillation frequency is locked by feedback-controlling the oscillation frequency.

Thereby, even when a feedback control is converged, an output frequency is not changed. Therefore, the voltage controlled oscillator can obtain substantially the same frequency tuning sensitivity over the variable-frequency range while outputting a desired frequency.

For example, when all of the switching elements of the m high-frequency switch circuit are OFF, the reference voltage control section may adjust the reference voltage so that a rate of a change in the oscillation frequency with respect to the control voltage is substantially constant over the control voltage, and in states other than when all of the switching elements of the m high-frequency switch circuits are OFF, the reference voltage control section may adjust the $(n+1)/2$-th reference voltage when n is an odd number and an intermediate voltage between the $n/2$-th reference voltage and the $(n+2)/2$-th reference voltage when n in an odd number, in the n variable capacitance circuits.

Thereby, it is possible to adjust the capacitance change rate so that a change rate of the oscillation frequency with respect to the control voltage is substantially the same as when all of the switching elements are OFF, in the vicinity of the reference voltage or the intermediate voltage.

For example, when the n variable capacitance circuits may be arranged in order of the reference voltage to be input thereto, the largest first, a difference between the reference voltage to be input to the variable capacitance element of the k-th variable capacitance circuit (k is a natural number of 2 or more and n or less) and the reference voltage to be input to the variable capacitance element of the $(k-1)$-th variable capacitance circuit is: maximum when all of the switching elements of the m high-frequency switch circuits are OFF; minimum when all of the switching elements of the m high-frequency switch circuits are ON; and an intermediate value between the maximum and minimum values in states other than when all of the switching elements of the m high-frequency switch circuits are ON or OFF.

Any one of the above-described voltage controlled oscillators may be used in a PLL circuit.

The above-described voltage controlled oscillator may be used in a wireless communication apparatus.

A third aspect of the present invention is directed to a PLL circuit for fixing an oscillation frequency, comprising a voltage controlled oscillator composed of a differential circuit for oscillating a high-frequency signal high-frequency signal, and adjusting an oscillation frequency, depending on a control voltage, and a feedback control voltage adjustment circuit of feeding back the high-frequency signal output by the voltage controlled oscillator, comparing a phase difference between the high-frequency signal and a reference signal, and adjusting the control voltage to be input to the voltage controlled oscillator. The voltage controlled oscillator comprises an inductor circuit having an inductor, n (n is a natural number of 2 or more) variable capacitance circuits connected in parallel with the inductor circuit, each having a variable capacitance element whose capacitance value is changed, depending on a control voltage applied, so as to feedback control an oscillation frequency, m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input, a negative resistance circuit connected in parallel with the inductor circuit, a frequency control section of controlling ON/OFF of the switching elements of the m high-frequency switch circuits to shift a band of the oscillation frequency, and a frequency tuning sensitivity control section connected to virtual ground points of the n variable capacitance circuits, and selectively switching a predetermined reference voltage and the control voltage as a voltage to be input to one terminal of each of the variable capacitance elements of the n variable capacitance circuits, depending on a shift of the oscillation frequency by ON/OFF of the switching elements of the m high-frequency switch circuit. The frequency tuning sensitivity control section uses as the reference voltage the control voltage output from the feedback control voltage adjustment circuit.

According to the third aspect of the present invention, a total capacitance value of the resonant circuit is not changed before and after the number of variable capacitance circuits functioning as variable capacitances is changed. Therefore, even when the PLL circuit is locked, a frequency output from the PLL circuit is not changed. Therefore, the PLL circuit can obtain substantially the same frequency tuning sensitivity over the variable-frequency range while outputting a desired frequency.

Thus, the present invention provides a voltage controlled oscillator which has satisfactory phase noise characteristics and can controls a frequency range over a wide band to obtain substantially the same frequency tuning sensitivity, and a PLL circuit and a wireless communication apparatus using the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the accompanying drawings.

(First Embodiment)

Figure 1:
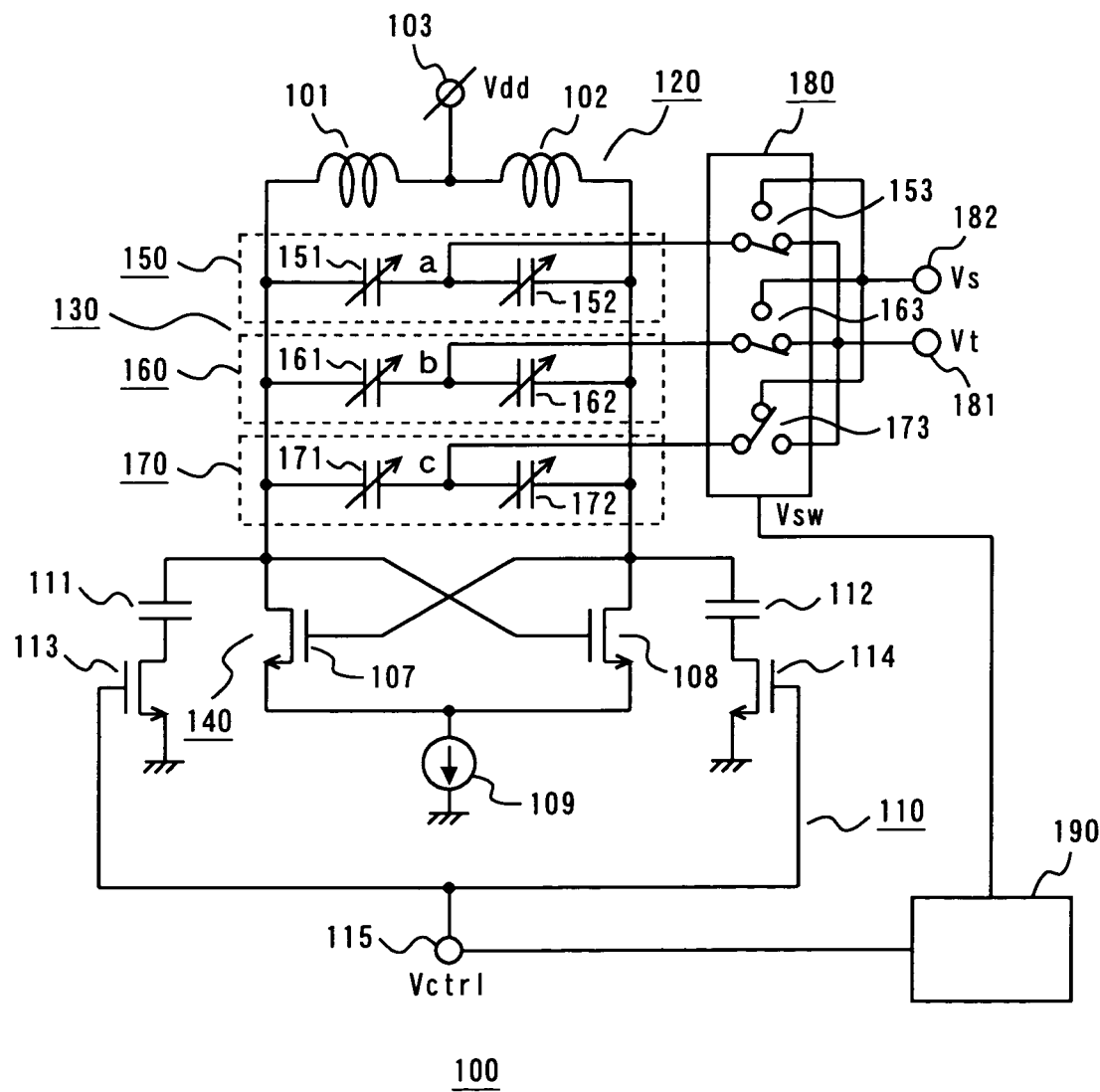
FIG. 1 is a circuit diagram illustrating a voltage controlled oscillator 100 according to a first embodiment of the present invention.

FIG. 1 is a circuit diagram illustrating a voltage controlled oscillator 100 according to a first embodiment of the present invention. Note that a bias circuit and the like are not illustrated in FIG. 1.

In FIG. 1, the voltage controlled oscillator 100 comprises an inductor circuit 120, a negative resistance circuit 140, a high-frequency switch circuit (band switching circuit) 110, a first variable capacitance circuit 150 (hereinafter referred to as a variable capacitance circuit A), a second variable capacitance circuit 160 (hereinafter referred to as a variable capacitance circuit B), a third variable capacitance circuit 170 (hereinafter referred to as a variable capacitance circuit C), a frequency tuning sensitivity control section 180, and a frequency control section 190. The inductor circuit 120, the negative resistance circuit 140, the high-frequency switch circuit 110, the variable capacitance circuit A, the variable capacitance circuit B, and the variable capacitance circuit C are connected in parallel to constitute an oscillation circuit.

The inductor circuit 120 comprises an inductor 101, an inductor 102 connected in series to the inductor 101, and a power source terminal 103 which is connected between the inductor 101 and the inductor 102 and through which a power source Vdd is supplied.

The negative resistance circuit 140 comprises two transistors 107 and 108 which are cross-coupled to each other.

The high-frequency switch circuit 110 comprises a capacitive element 111, a switching element 113, a switching element 114, and a capacitive element 112. A control voltage terminal 115 is connected to a connection point of the switching element 113 and the switching element 114 so as to supply a control voltage Vctrl to the switching elements 113, 114.

The variable capacitance circuit A comprises a variable capacitance element 151 and a variable capacitance element 152 connected in series to the variable capacitance element 151.

The variable capacitance circuit B comprises a variable capacitance element 161 and a variable capacitance element 162 connected in series to the variable capacitance element 161.

The variable capacitance circuit C comprises a variable capacitance element 171 and a variable capacitance element 172 connected in series to the variable capacitance element 171.

The variable capacitance circuit A, the variable capacitance circuit B, and the variable capacitance circuit C constitute a variable capacitance circuit 130 of the voltage controlled oscillator 100.

The high-frequency switch circuit 110, the inductor circuit 120, and the variable capacitance circuit 130 constitute a resonant circuit of the voltage controlled oscillator 100.

The sources of the transistors 107, 108 are connected to each other and are connected to one terminal of a current source 109. The other terminal of the current source 109 is grounded.

The variable capacitance elements 151, 152, 161, 162, 171, 172 utilize a gate capacitance which is used in a CMOS process.

In the variable capacitance circuit A, a switch 153 which switches direct current voltages is connected to a connection point (hereinafter referred to as a connection point a) of the variable capacitance element 151 and the variable capacitance element 152.

In the variable capacitance circuit B, a switch 163 is connected to a connection point (hereinafter referred to as a connection point b) of the variable capacitance element 161 and the variable capacitance element 162.

In the variable capacitance circuit C, a switch 173 is connected to a connection point (hereinafter referred to as a connection point c) of the variable capacitance element 171 and the variable capacitance element 172.

One ends of the switches 153, 163, 173 are connected together and are connected to a control voltage terminal 181. The other ends of the switches 153, 163, 173 are connected together and are connected to a reference voltage terminal 182. The switches 153, 163, 173 constitute the frequency tuning sensitivity control section 180.

One output of the frequency control section 190 is connected to the control voltage terminal 115. The frequency control section 190 supplies the control voltage Vctrl to the control voltage terminal 115. The other output of the frequency control section 190 is connected to the frequency tuning sensitivity control section 180. The frequency control section 190 supplies to the frequency tuning sensitivity control section 180 a control voltage Vsw for switching ON and/or OFF the switches 153, 163, 173.

The control voltage terminal 181 supplies the control voltage Vt. The control voltage Vt is obtained by feeding back an oscillation frequency and comparing the oscillation frequency with a reference frequency in the PLL circuit, and is used to control the oscillation frequency (feedback control). The reference voltage terminal 182 supplies a reference voltage Vs.

Next, an operation of the thus-obtained voltage controlled oscillator 100 of the first embodiment of the present invention will be described.

Figure 2A:
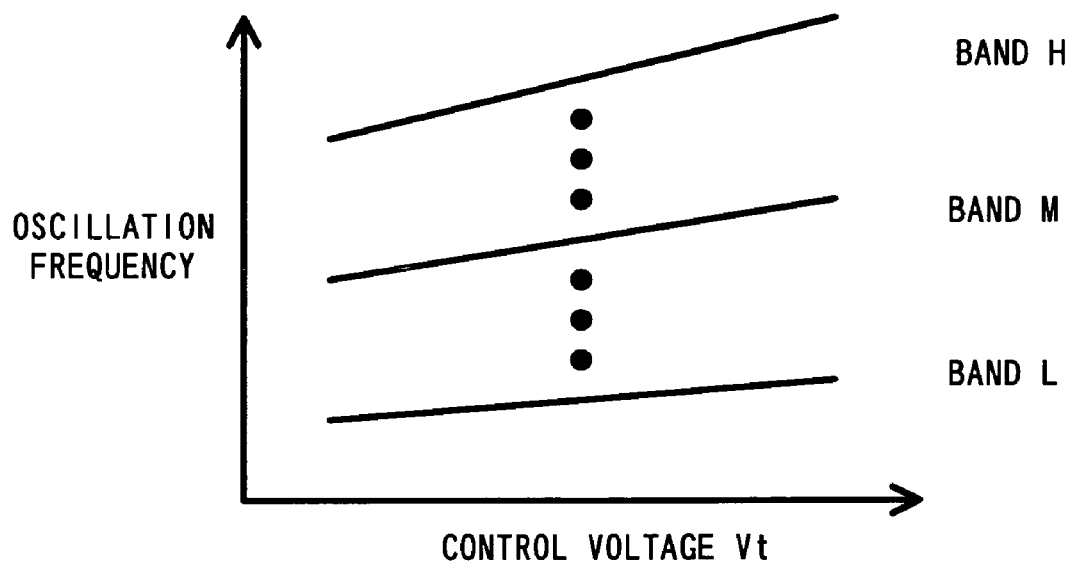
FIG. 2A is a graph illustrating oscillation frequencies of the voltage controlled oscillator 100 when a switch 153 is connected to a control voltage terminal 181 while switches 163, 173 are connected to the reference voltage terminal 182.

FIG. 2A is a graph illustrating oscillation frequencies of the voltage controlled oscillator 100 when the switch 153 is connected to the control voltage terminal 181 while the switches 163, 173 are connected to the reference voltage terminal 182. In this case, the variable capacitance circuit A operates as a variable capacitance. The variable capacitance circuit B and the variable capacitance circuit C operate as fixed capacitances. It is here assumed that there are a plurality of high-frequency switch circuits. FIG. 2A illustrates a band having the highest oscillation frequency (hereinafter referred to as a band H), a band having the lowest oscillation frequency (hereinafter referred to as a band L), and a band having an intermediate oscillation frequency (hereinafter referred to as a band M).

By changing the control voltage Vt supplied from the control voltage terminal 181, a capacitance value of the variable capacitance circuit 130 can be changed, so that the oscillation frequency is changed in an analog manner (horizontal direction). The frequency control section 190 can change the control voltage Vctrl to be supplied to the control voltage terminal 115 so as to switch ON and/or OFF the switching elements 113, 114 of the high-frequency switch circuit 110, thereby changing the oscillation frequency in a digital manner (vertical direction).

When the switch 153 is connected to the control voltage terminal 181 while the switches 163, 173 are connected to the reference voltage terminal 182, the frequency tuning sensitivity is highest for the band H, and is decreased in order of the band M, the band L.

This is because the frequency tuning sensitivity is determined based on a ratio of a change amount in capacitance of the variable capacitance circuit to a total capacitance value of the resonant circuit. Since all of the switching elements of the high-frequency switch circuit are switched OFF for the band H and ON for the band L, the total capacitance value of the resonant circuit is larger for the band L than for the band H. Therefore, the ratio of the capacitance change amount of the variable capacitance circuit to the total capacitance value of the resonant circuit is higher for the band H than for the band L, and therefore, the frequency tuning sensitivity is higher for the band H than for the band L.

Therefore, as in the voltage controlled oscillator 100 of the first embodiment of FIG. 1, the frequency tuning sensitivity control section 180 and the frequency control section 190 are used to cause the switches 153, 163, 173 of the frequency tuning sensitivity control section 180 to be switched in synchronization with switching of the high-frequency switch circuit 110, thereby making it possible to change the number of parallel-connected variable capacitance elements used in variable capacitance circuits, for each band, to obtain substantially the same frequency tuning sensitivity for the bands. As used herein, the term "the number of parallel-connected variable capacitance circuits" refers to the number of variable capacitance circuits which operate as variable capacitances in the variable capacitance circuits 150 to 170.

Next, an operation with which substantially the same frequency tuning sensitivity is obtained for all bands will be described with reference to FIG. 2B.

For example, in the case of the band H, the oscillation frequency is highest and the total capacitance value of the resonant circuit is smallest, compared to the band M and the band L. Since the total capacitance value of the resonant circuit is small, the frequency tuning sensitivity is high with respect to a change in the capacitance of the variable capacitance circuit. In this case, only the switch 153 is connected to the control voltage terminal 181 so that the variable capacitance circuit A is used as a variable capacitance element, while the remaining switches 163, 173 are connected to the reference voltage terminal 182 so that the variable capacitance circuits B and C are used as fixed capacitance elements, but not variable capacitance elements. In this case, a change in the oscillation frequency with respect to the control voltage Vt is represented with a solid line L1 in FIG. 2B where the oscillation frequency is highest.

In the case of the band L, the oscillation frequency is lowest and the total capacitance value of the resonant circuit is largest, compared to the bands H and M. Therefore, similar to the band H, when only the switch 153 is connected to the control voltage terminal 181 while the switches 163, 173 are connected to the reference voltage terminal 182, the frequency tuning sensitivity is lowered as compared to the band H. In this case, a change in the oscillation frequency with respect to the control voltage Vt is represented by a dashed line L2 in FIG. 2B where the frequency is lowest.

Therefore, in the case of the band L, when the switches 153, 163, 173 are connected to the control voltage terminal 181 so that all of the variable capacitance circuits A, B and C are used as variable capacitance elements, the ratio of the capacitance change amount of the variable capacitance circuit to the total capacitance value of the resonant circuit can be larger than when only the variable capacitance circuit A is used as a variable capacitance, thereby making it possible to obtain substantially the same frequency tuning sensitivity as that of the band H. In this case, a change in the oscillation frequency with respect to the control voltage Vt is represented by a solid line L3 in FIG. 2B where the frequency is lowest. When the solid line L3 is compared to the dashed line L2, it will be understood that the frequency tuning sensitivity is substantially as high as that of the band H.

Figure 2B:
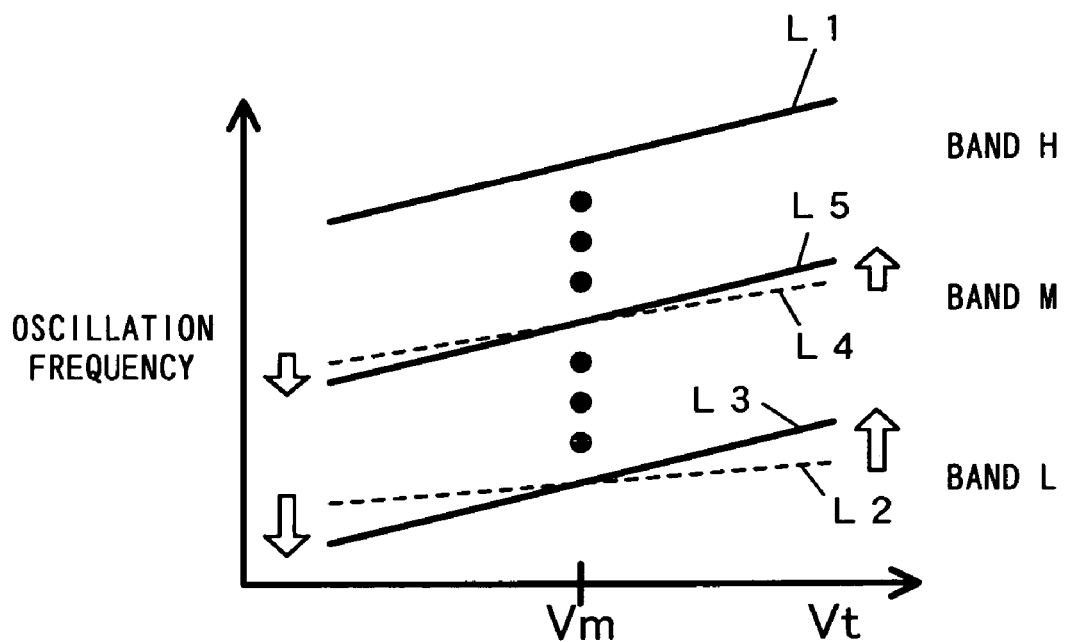
FIG. 2B is a diagram for explaining an operation which obtains substantially the same frequency tuning sensitivity for all bands.

For example, as illustrated in FIG. 2B, a middle point of the range of the variable control voltage Vt supplied from the control voltage terminal 181 is represented by Vm [V] and the reference voltage Vs supplied from the reference voltage terminal 182 is represented by Vm. In the case of the band L, frequency characteristics are compared between when only the switch 153 is connected to the control voltage terminal 181 (the dashed line L2) and when the switches 153, 163, 173 are connected to the control voltage terminal (the solid line L3). In this case, as illustrated in FIG. 2B, the following frequency characteristics are obtained. Assuming that the reference voltage Vs (=Vm) supplied from the reference voltage terminal 182 as a center, when Vt<Vm, the oscillation frequency is lower on the solid line L3 than on the dashed line L2. When Vt>Vm, the oscillation frequency is higher on the solid line L3 than on the dashed line L2. As a result, the frequency tuning sensitivity is higher on the solid line L3 than on the dashed line L2. When Vt=Vm, the oscillation frequency is not changed.

In the case of the band M, the oscillation frequency is intermediate, and the total capacitance value of the resonant circuit is also intermediate, compared to the bands H and L. Therefore, similar to the band H, when only the switch 153 is connected to the control voltage terminal 181 and the switches 163, 173 are connected to the reference voltage terminal 182, the frequency tuning sensitivity takes an intermediate value between those of the bands H and L. In this case, a change in the oscillation frequency with respect to the control voltage Vt is represented by a dashed line L4 in FIG. 2B where the oscillation frequency is intermediate.

In the case of the band M, in order to obtain substantially the same frequency tuning sensitivity as that of the band H, the switches 153, 163 may be connected to the control voltage terminal 181, the variable capacitance circuits A and B may be used as variable capacitance elements, the remaining switch 173 may be connected to the reference voltage terminal 182, and the variable capacitance circuit C may be used as a fixed capacitance element, but not a variable capacitance element. In this case, a change in the oscillation frequency with respect to the control voltage Vt is represented by a solid line L5 in FIG. 2B where the oscillation frequency is intermediate. When the dashed line L4 and the solid line L5 are compared, it will be understood that the frequency tuning sensitivity is slightly increased to substantially the same level as that of the band H.

Thus, by using a switch to determine, for each band, whether a DC voltage to be supplied to a plurality of variable capacitance circuits connected in parallel is connected to the control voltage terminal 181 or the reference voltage terminal 182, a capacitance change rate of of a whole variable capacitance circuit (including a plurality of variable capacitance circuits) with respect to the control voltage Vt is adjusted. Thereby, it is possible to obtain substantially the same frequency tuning sensitivity over all of the bands. As used herein, the capacitance change rate of of the whole variable capacitance circuit with respect to the control voltage Vt is obtained by dividing a capacitance change amount of the whole variable capacitance circuit when the control voltage Vt is changed by a predetermined amount, by a change amount of the control voltage Vt. Specifically, the capacitance change rate of the whole variable capacitance circuit with respect to the control voltage Vt=(the change amount of the whole variable capacitance circuit when the control voltage Vt is changed by a predetermined amount)/(the change amount of the control voltage Vt).

A series of operations thus described are controlled by the frequency control section 190. The frequency control section 190 inputs the control voltage Vsw, which depends on the control voltage Vctrl to be input to the control voltage terminal 115 of the high-frequency switch circuit 110, to the frequency tuning sensitivity control section 180. A relationship between the control voltage Vctrl and the control voltage Vsw is previously determined. Specifically, in order to obtain a desired frequency, the frequency control section 190 determines the control voltage Vctrl so as to determine a band to be used, and in synchronization with this, determines the control voltage Vsw. The frequency control section 190, when switching bands, outputs the control voltage Vsw for determining whether the switch of the frequency tuning sensitivity control section 180 is connected to the control voltage terminal 181 or the reference voltage terminal 182, so as to obtain a desired frequency tuning sensitivity value for a band to be used. The frequency tuning sensitivity control section 180 turns the switch in accordance with a predetermined rule, depending on the control voltage Vsw.

In the case of the band H, only the variable capacitance circuit A of the variable capacitance circuit 130 is used as a variable capacitance circuit. Therefore, in the case of the band H, the variable capacitance elements 151, 152 constituting the variable capacitance circuit A may have an element value which causes the frequency tuning sensitivity to be substantially the same as those of the other bands. In other words, it is preferable that the variable capacitance element used in the variable capacitance circuit A has a selected element value which causes the frequency tuning sensitivity to be appropriate for a band having the highest frequency.

In the case of the band L, the variable capacitance circuits A, B and C of the variable capacitance circuit 130 are all used as variable capacitance circuits. Therefore, in the case of the band L, a sum of element values of the variable capacitance elements used in the variable capacitance circuit 130 may be a value which causes the frequency tuning sensitivity to be substantially the same as those of the other bands. In other words, it is preferable that a maximum value of the sum of the variable capacitance elements used in the variable capacitance circuit 130 may have a selected element value which causes the frequency tuning sensitivity to be appropriate for a band having the lowest band. The sum of element values of variable capacitance elements of a variable capacitance circuit (e.g., the variable capacitance circuits A, B and C connected in parallel of the variable capacitance circuit 130) may have a selected value which causes the frequency tuning sensitivity to be appropriate for the band L having the lowest frequency.

The connection point a of the variable capacitance elements 151, 152 of the variable capacitance circuit A, the connection point b of the variable capacitance elements 161, 162 of the variable capacitance circuit B, and the connection point c of the variable capacitance elements 151, 152 of the variable capacitance circuit C are all virtual ground points of differential signals of the variable capacitance circuits. Therefore, a high-frequency signal does not flow out from the connection points a, b and c. Therefore, when the switches 153, 163, 173 are used as the frequency tuning sensitivity control section 180, loss of the high-frequency signal does not occur. The phase noise characteristics of the voltage controlled oscillator are proportional to a Q factor (an indicator indicating loss) of the resonant circuit at the oscillation frequency. Therefore, the loss of the resonant circuit is large. In other words, when the Q factor is low, phase noise is worsened. In the variable capacitance circuit 130 of FIG. 1, the use of the frequency tuning sensitivity control section 180 prevents deterioration of the Q factor, thereby avoiding a worsening of phase noise.

Thus, in the variable capacitance circuit 130 used in the voltage controlled oscillator 100 of the first embodiment of the present invention, the frequency tuning sensitivity control section 180 for causing the frequency tuning sensitivity to be substantially the same for all bands is provided closer to the outside than the connection points a, b and c (virtual ground points), so that loss of a high-frequency signal does not occur in the frequency tuning sensitivity control section 180. Therefore, the Q factor of the resonant circuit is the same as when the frequency tuning sensitivity control section 180 is not used, thereby preventing a worsening of phase noise.

Figure 3A:
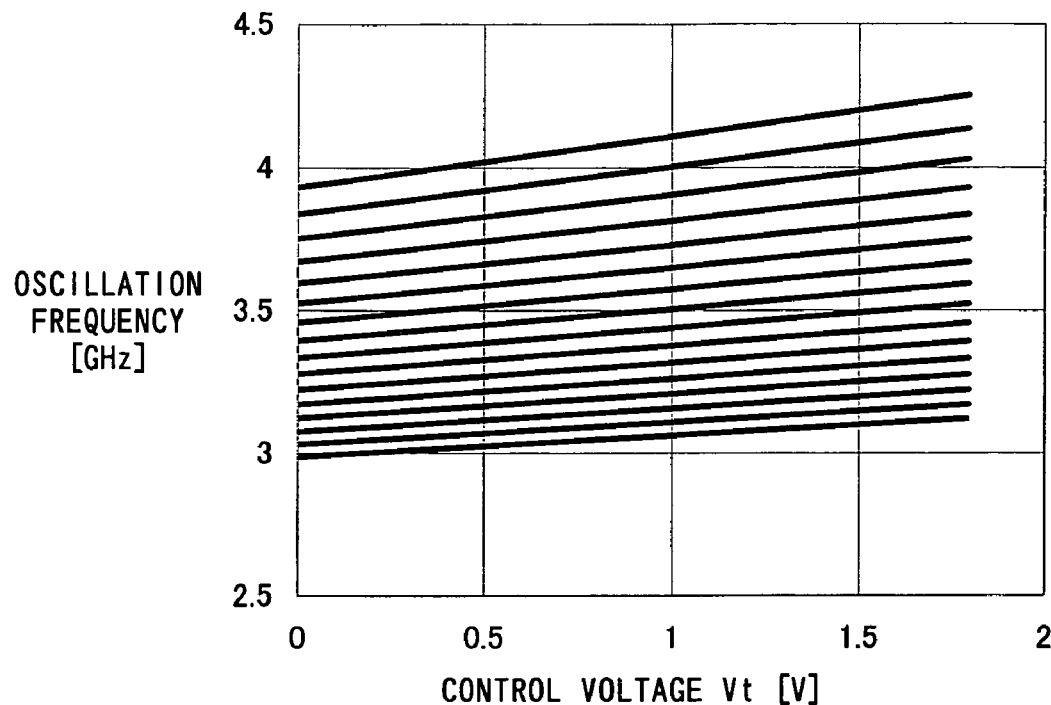
FIG. 3A is a graph illustrating oscillation frequency characteristics when the number of variable capacitance circuits connected in parallel in a variable capacitance circuit 130 is N=1, and the number of bands is 16.
Figures 4, 5:
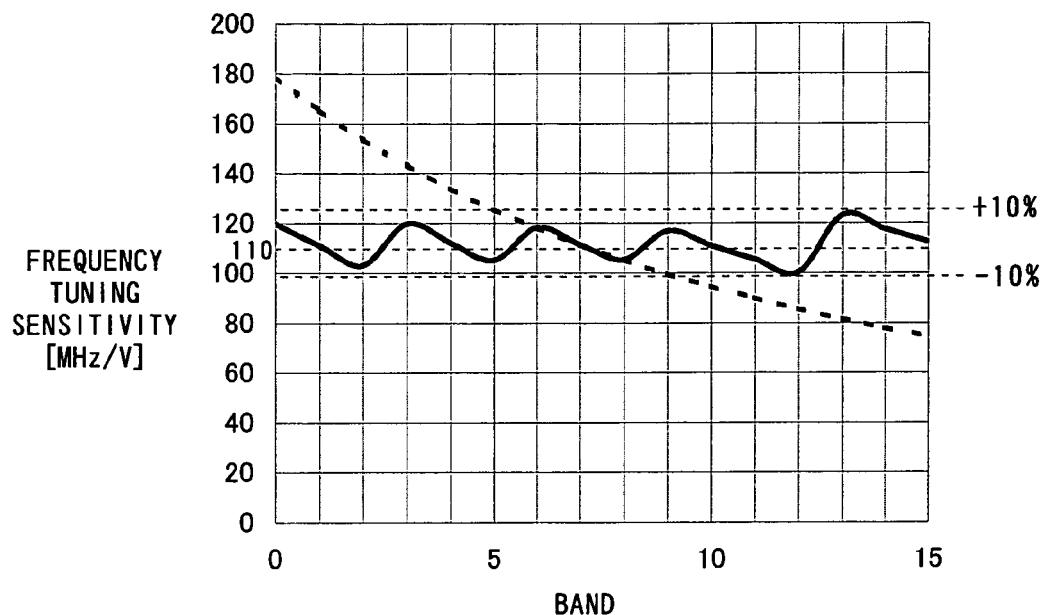
FIG. 4 is a graph illustrateing frequency tuning sensitivity for each band.
FIG. 5 is a table indicating a rule which determines whether each of the variable capacitance circuits A to E is used as a variable capacitance or a fixed capacitance.

FIG. 3A is a graph illustrating oscillation frequency characteristics when the number of variable capacitance circuits connected in parallel in the variable capacitance circuit 130 is N=1, and the number of bands is 16. It is here assumed that an element value of variable capacitance elements used in the variable capacitance circuit (the element value is also referred to as a unit transistor number or a unit basic cell number) is 12. FIG. 4 illustrates frequency tuning sensitivity for each band with a dashed line. The horizontal axis of FIG. 4 represents band numbers 0, 1, 2, . . . , 15 in order of oscillation frequency (highest first). The vertical axis of FIG. 4 represents frequency tuning sensitivity [MHz/V]. When the same variable capacitance circuit is used for all bands, the frequency tuning sensitivity is decreased with an increase in the band number, i.e., a decrease in the oscillation frequency, as illustrated in FIG. 4. The frequency tuning sensitivity of the band 0 is about 2.4 times as high as the frequency tuning sensitivity of the band 15.

Figure 3B:
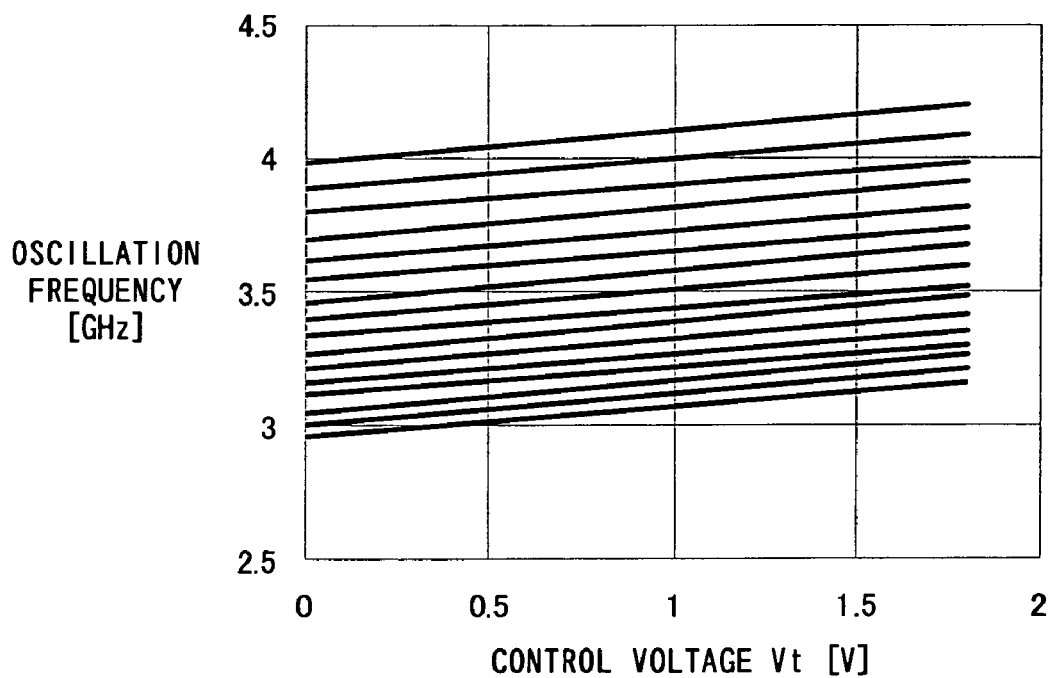
FIG. 3B is a graph illustrating oscillation frequency characteristics when the number of variable capacitance circuits connected in parallel in the variable capacitance circuit 130 is N=5 (variable capacitance circuits A, B, C, D, E) and the number of bands is 16.

FIG. 3B is a graph illustrating oscillation frequency characteristics when the number of variable capacitance circuits connected in parallel in the variable capacitance circuit 130 is N=5 (variable capacitance circuits A, B, C, D, E) and the number of bands is 16. FIG. 5 is a table indicating a rule which determines whether each of the variable capacitance circuits A to E is used as a variable capacitance or a fixed capacitance. It is here assumed that a ratio of element values of the variable capacitance circuits A to E is A:B:C:D:E=8:2:2:2:4. In FIG. 5, an open circle indicates that the variable capacitance circuits A to E are used as variable capacitances, and a cross indicates that the variable capacitance circuits A to E are used as fixed capacitances. The control voltage Vt is here assumed to be used in the range of 0 [V] to 1.8 [V]. The reference voltage Vs is assumed to be at a middle of the range of the variable control voltage Vt, i.e., Vs=0.9 [V]. In FIG. 4, the frequency tuning sensitivity of each band is represented by a solid line. As illustrated in FIG. 5, for the bands 0 to 2, the variable capacitance circuit A is used as a variable capacitance; for the bands 3 to 5, the variable capacitance circuits A, B are used as variable capacitances; for the bands 6 to 8, the variable capacitance circuits A, B, C are used as variable capacitances; for the bands 9 to 12, the variable capacitance circuits A, B, C, D is used as variable capacitances; and for the bands 13 to 15, the variable capacitance circuits A, B, C, D, E are used as variable capacitances. As indicated with the solid line in FIG. 4, the frequency tuning sensitivity falls within about ±10% of 110 [MHz/V]. Therefore, as indicated with the dashed lines in FIG. 4, it will be understood that a difference in frequency tuning sensitivity between each band is significantly reduced as compared to when the same variable capacitance circuit is used. As described above, by changing the number of parallel-connected variable capacitance circuits in a stepwise manner, but not for all bands, it is possible to obtain substantially the same frequency tuning sensitivity for all of the bands.

Figure 3C:
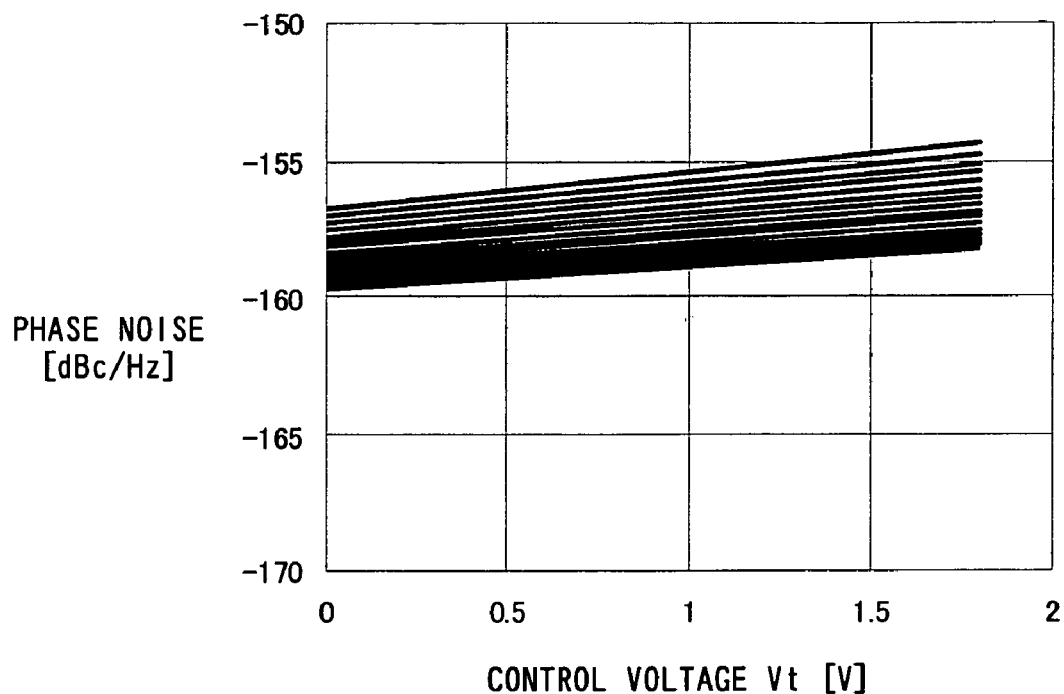
FIG. 3C is a graph illustrating oscillation frequency characteristics when the number of variable capacitance circuits connected in parallel in the variable capacitance circuit 130 is N=1 and the number of bands is 16 (corresponding to FIG. 3A)
Figure 3D:
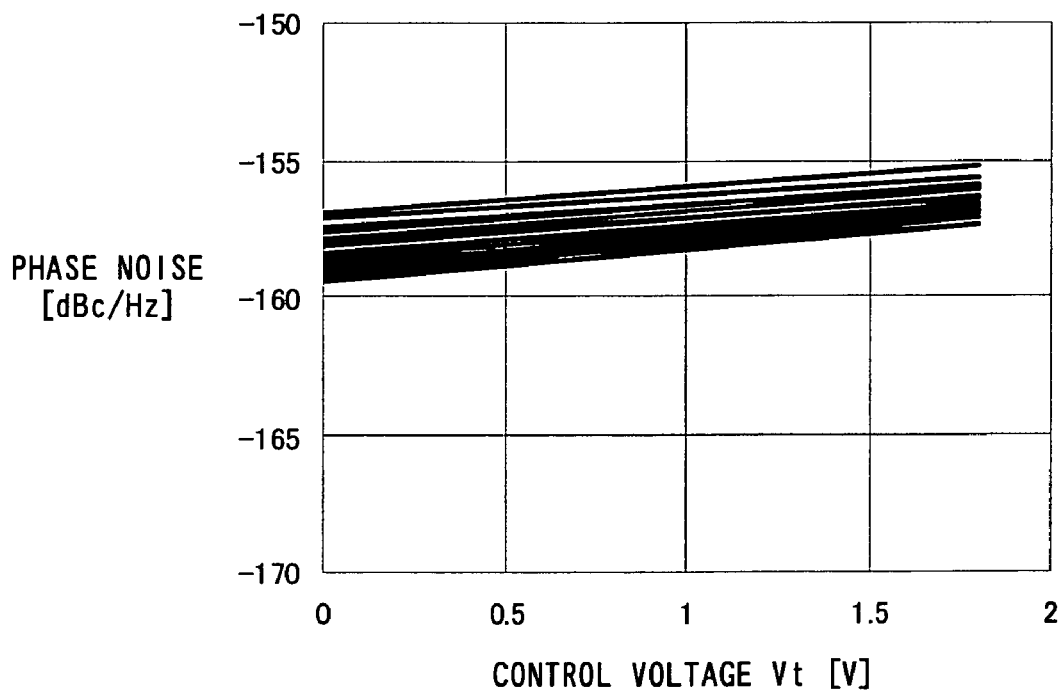
FIG. 3D is a graph illustrating oscillation frequency characteristics when the number of variable capacitance circuits connected in parallel in the variable capacitance circuit 130 is N=5 and the number of bands is 16 (corresponding to FIG. 3B)

FIG. 3C is a graph illustrating oscillation frequency characteristics when the number of variable capacitance circuits connected in parallel in the variable capacitance circuit 130 is N=1 and the number of bands is 16 (corresponding to FIG. 3A). FIG. 3D is a graph illustrating oscillation frequency characteristics when the number of variable capacitance circuits connected in parallel in the variable capacitance circuit 130 is N=5 and the number of bands is 16 (corresponding to FIG. 3B). As can be seen from comparison of FIGS. 3C and 3D, even when the number of variable capacitance circuits connected in parallel is increased to adjust the capacitance change rate of the whole variable capacitance circuit for each band, the phase noise characteristics are not deteriorated.

Note that the frequency control section 190 is implemented, for example, using an integrated circuit or the like in which a predetermined operation is previously programmed and the table of FIG. 5 is previously stored. The frequency control section 190 determines which variable capacitance circuit is used as a variable capacitance with reference to the table, depending on the control voltage Vctrl for switching to a desired band, and inputs to the frequency tuning sensitivity control section 180 the control voltage Vsw for turning a switch to connect the variable capacitance circuit to be used as a variable capacitance to the control voltage terminal 181. The frequency tuning sensitivity control section 180 is implemented, for example, using an integrated circuit or the like in which a predetermined operation is previously programmed and a table is stored which indicates which switch is connected to the control voltage terminal 181 and/or the reference voltage terminal 182, depending on the control voltage Vsw input from the frequency control section 190. The frequency tuning sensitivity control section 180 determines which switch is turned with reference to the table and based on the input control voltage Vsw, and turns the selected switch. Thereby, the capacitance change amount of the variable capacitance circuit 130 is adjusted, depending on a band used.

In the first embodiment, the variable capacitance circuit 130 is composed of the three variable capacitance circuits A, B and C connected in parallel as illustrated in FIG. 1. However, the number of variable capacitance circuits connected in parallel is not limited to three, and may be five as illustrated in FIG. 5, or alternatively, two, or four or more. In other words, the number of variable capacitance circuits may be n (n: a natural number of 2 or more). In this case, the frequency tuning sensitivity control section 180 may be connected to virtual ground points of the n variable capacitance circuits and may adjust a capacitance change rate of the whole variable capacitance circuit (including the n variable capacitance circuits) with respect to the control voltage Vt. For any n, an effect similar to that described above is obtained.

Although the high-frequency switch circuit 110 is composed of a high-frequency switch circuit including the capacitive element 111 and the switching element 113, and a high-frequency switch circuit including the capacitive element 112 and the switching element 114 in FIG. 1, the present invention is not limited to this. The high-frequency switch circuit 110 may be composed of m high-frequency switch circuits (m: a natural number of 1 or more) including a capacitive element, a switching element connected to the capacitive element, and a switching control terminal receiving a control voltage for controlling ON/OFF of the switching element.

In the first embodiment, the variable capacitance circuit 130 is composed of the variable capacitance circuits A, B and C, and a switch is connected to each of the connection points a, b and c thereof. However, a switch does not have to be connected to all of the connection points. For example, in the structure of FIG. 5, the variable capacitance circuit A is always used as a variable capacitance circuit, the connection point a may not be connected to the switch 153 and may be connected directly to the control voltage terminal 181. Also in this case, an effect similar to that described above is obtained. Specifically, when n variable capacitance circuits are provided, the frequency tuning sensitivity control section may include n−1 switching elements. The switching elements may be connected to virtual ground points of the n−1 respective variable capacitance circuits, and may be selectively switched to determine whether voltages to be applied to the respective variable capacitance circuits are a predetermined reference voltage or the control voltage. The control voltage may be supplied to the virtual ground point of one variable capacitance, but not via the switching element.

In the first embodiment, the frequency control section 190 has two output terminals, which are connected to the control voltage terminal 115 and the frequency tuning sensitivity control section 180, and the control voltage Vctrl and the control voltage Vsw are supplied thereto, respectively. However, the control voltage Vctrl does not have to be necessarily output. For example, the frequency control section 190 may supply the control voltage Vsw to the frequency tuning sensitivity control section 180 in synchronization with the control voltage Vctrl output from another component. Also in this case, an effect similar to that described above is obtained.

In the first embodiment, the frequency control section 190 has two output terminals, which are connected to the control voltage terminal 115 and the frequency tuning sensitivity control section 180, and the control voltage Vctrl and the control voltage Vsw are supplied thereto, respectively. However, the present invention is not limited to this structure. For example, the frequency control section 190 may have three output terminals, one of which may be connected to the reference voltage terminal 182 so that the reference voltage Vs is supplied to the reference voltage terminal 182. In this case, the frequency control section 190 may supply the control voltage Vsw and the reference voltage Vs in synchronization with the control voltage Vctrl so as to obtain a desired value of frequency tuning sensitivity for a band used. Also in this case, an effect similar to that described above is obtained.

In the first embodiment, the ratio of the element values of a plurality of variable capacitance circuits is 8:2:2:2:4 in, for example, the circuit structure of FIG. 5, so that all of the variable capacitance circuits other than the variable capacitance circuit A do not have the same element value. However, the present invention is not limited to this. For example, the ratio of the element values may be 8:2:2:2:2 (i.e., all of the variable capacitance circuits other than the variable capacitance circuit A have the same element value), 8:2:3:4:5 (i.e., all of the variable capacitance circuits have different element values) or 2:2:2:2:2 (i.e., all of the variable capacitance circuits A to E have the same element value). Also in this case, an effect similar to that described above is obtained.

In the first embodiment, the high-frequency switch circuit 110 is composed of the capacitive element 111, the switching element 113, the switching element 114, and the capacitive element 112. However, the present invention is not limited to this structure. Any structure which allows switching of oscillation frequency bands in a stepwise manner may be used. Also in this case, an effect similar to that described above is obtained.

In the first embodiment, the reference voltage Vs supplied from the reference voltage terminal 182 is set to be Vm which is a value at a middle point of the range of the variable control voltage Vt supplied from the control voltage terminal 181, but is not necessarily limited to Vm. For example, the reference voltage Vs may be ground or the power source Vdd, or alternatively, any voltage. When the voltage controlled oscillator is composed of a PLL circuit, the oscillation frequency may be feedback controlled to be locked and the resultant control voltage may be used as the reference voltage Vs. In any of these cases, an effect similar to that described above is obtained.

It is now assumed that the voltage controlled oscillator is composed of m high-frequency switch circuits. As illustrated in the band 0 of FIG. 5, the switching elements in the frequency tuning sensitivity control section may be controlled so that, when all switching elements of the m high-frequency switch circuits are OFF, a control voltage is applied to only one of n variable capacitance circuits, while a reference voltage is applied to the remaining n−1 variable capacitance circuits. The switching elements in the frequency tuning sensitivity control section may also be controlled so that, when all of the switching elements of the m high-frequency switch circuit are ON, a control voltage is applied to all of the n variable capacitance circuits, as illustrated in the band 15 of FIG. 5.

(Second Embodiment)

Figure 6A:
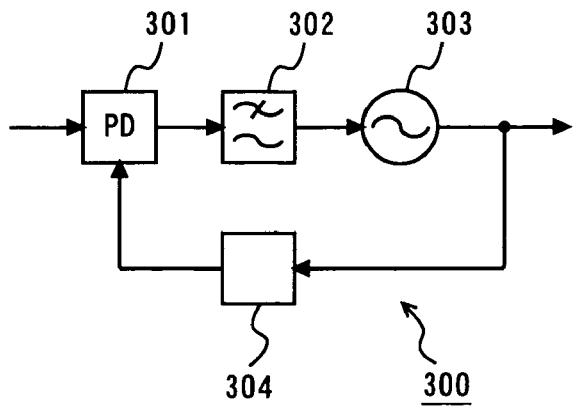
FIG. 6A is a block diagram illustrating a structure of a PLL circuit according to a second embodiment of the present invention.

FIG. 6A is a block diagram illustrating a structure of a PLL circuit according to a second embodiment of the present invention. The above-described voltage controlled oscillator of the first embodiment is mainly used in PLL circuits, such as that illustrated in FIG. 6A. In FIG. 6A, a PLL circuit 300 comprises a phase comparator 301, a loop filter 302, a voltage controlled oscillator 303, and a frequency divider 304. The PLL circuit is a circuit which fixes (locks) an oscillation frequency to a desired frequency. The voltage controlled oscillator 303 is similar to the voltage controlled oscillator of the first embodiment. The phase comparator 301 compares a phase of an input reference signal with a phase of a signal obtained by frequency-dividing an output signal of the voltage controlled oscillator 303 using the frequency divider 304. An output signal of the phase comparator 301 is input to the loop filter 302. The loop filter 302 converts the output signal of the phase comparator 301 to a direct current component, which is in turn input to the voltage controlled oscillator 303. An output signal output from the loop filter 302 is input as the control voltage Vt to the control voltage terminal 181 of the voltage controlled oscillator 303. Thereby, a desired frequency is output from the voltage controlled oscillator 303.

Figure 6B:
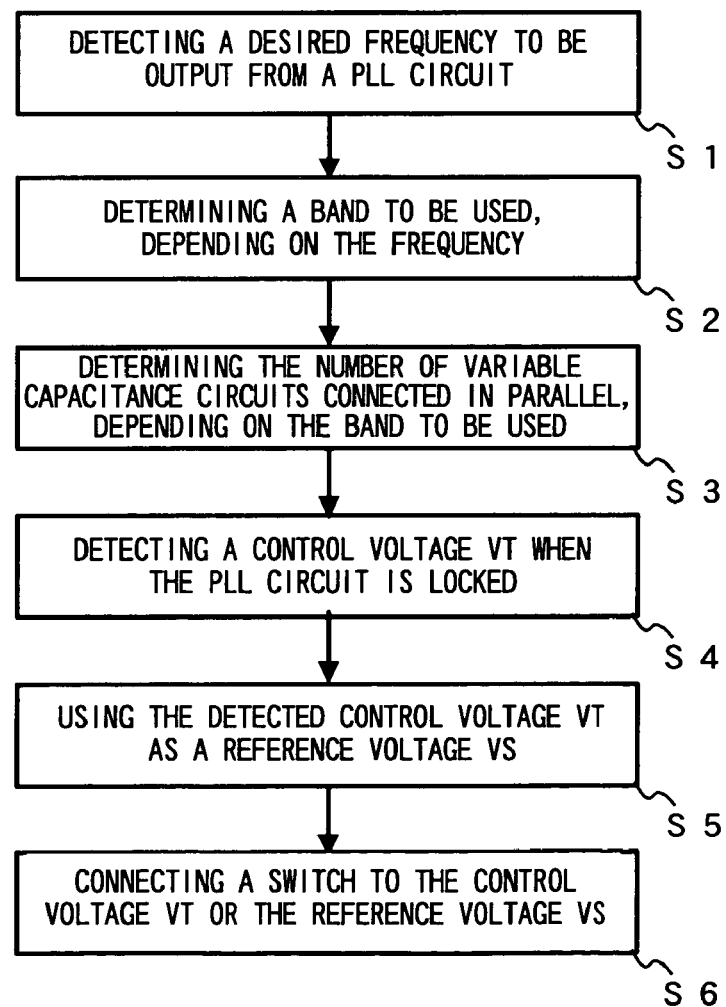
FIG. 6B is a flowchart illustrating an operation of a voltage controlled oscillator 303 of the second embodiment of the present invention.

FIG. 6B is a flowchart illustrating an operation of the voltage controlled oscillator 303 of the second embodiment. Hereinafter, an operation of the voltage controlled oscillator 303 will be described with reference to FIG. 6B. It is assumed that, at a time when the PLL circuit 300 starts operating, variable capacitance circuits 150, 160, 170 have been operating as variable capacitances, and the control voltage Vt has been being applied to the variable capacitance circuits 150, 160, 170.

Firstly, the frequency control section 190 of the voltage controlled oscillator 303 detects a desired frequency to be output from the PLL circuit 300 (step S1). In this case, when the PLL circuit 300 is locked, the frequency control section 190 of the voltage controlled oscillator 303 may perform the operation of step S1 by detecting a frequency of the output signal of the PLL circuit 300 or by detecting a desired frequency from a circuit block which determines the desired frequency and transfers a command to the PLL circuit 300.

Next, the frequency control section 190 of the voltage controlled oscillator 303 determines a band which is to be used in the voltage controlled oscillator 303, depending on the frequency which is detected in step S1 and is to be output from the PLL circuit 300 (step S2).

Next, based on the determined band, the frequency control section 190 of the voltage controlled oscillator 303 determines the number of parallel-connected variable capacitance circuits used as variable capacitances in the variable capacitance circuit 130 (step S3). Specifically, the frequency control section 190 of the voltage controlled oscillator 303 previously stores a table in which a band is associated with the number of parallel-connected variable capacitance circuits used as variable capacitances, and references it to determine the number of parallel-connected variable capacitance circuits to be used as variable capacitances.

After step S3, the PLL circuit 300 locks an oscillation frequency to the desired frequency. After the PLL circuit 300 is locked, the frequency control section 190 of the voltage controlled oscillator 303 detects the control voltage Vt input thereto (step S4).

Next, the voltage controlled oscillator 303 supplies the control voltage Vt as a reference voltage Vs (=Vt) to the reference voltage terminal 182 (step S5).

Finally, the frequency control section 190 of the voltage controlled oscillator 303 inputs the control voltage Vsw to the frequency tuning sensitivity control section 180 so that, in the variable capacitance circuit 130, a switch of a variable capacitance circuit used as a variable capacitance is connected to the control voltage terminal 181, while a switch of a variable capacitance circuit used as a fixed capacitance is connected to the reference voltage terminal 182 (step S6).

Figure 7:
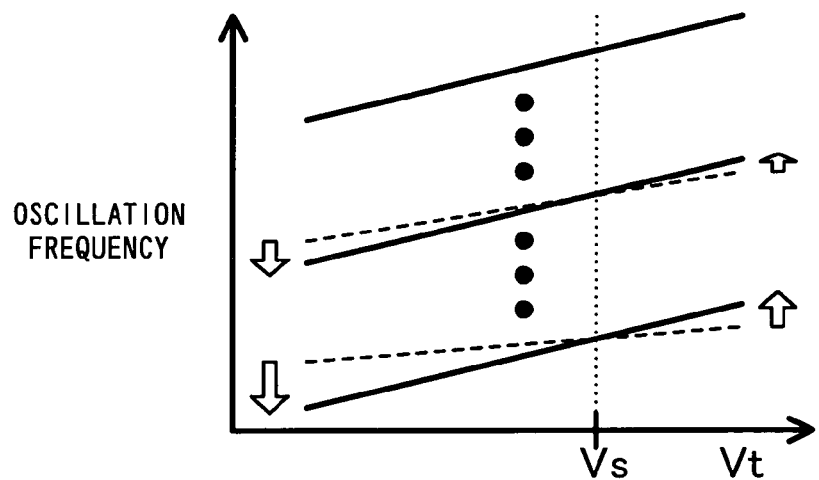
FIG. 7 is a diagram illustrating how frequency characteristics are changed by control according to the second embodiment of the present invention.

FIG. 7 is a diagram illustrating how frequency characteristics are changed by control according to the second embodiment of the present invention. In this case, as illustrated in FIG. 7, the oscillation frequency with respect to the control voltage Vt is decreased in the range of Vs>Vt and is increased in the range of Vs<Vt (the reference voltage Vs is a center). Thereby, the frequency tuning sensitivity can be set to be an appropriate value. In the second embodiment, the reference voltage Vs is the control voltage Vt when the PLL circuit is locked, and therefore, the total capacitance value of the resonant circuit is not changed before and after the number of variable capacitance circuits connected in parallel is changed (before and after the operation of step S6). This is because the same control voltage is input to the variable capacitance circuit used as a fixed capacitance and the variable capacitance circuit used as a variable capacitance before and after the number of variable capacitance circuits connected in parallel is changed. Therefore, even when the PLL circuit 300 is already locked, the frequency output from the PLL circuit is not changed before and after the number of variable capacitance circuits connected in parallel is changed, thereby outputting a desired frequency without a change. Therefore, a voltage controlled oscillator which can obtain substantially the same frequency tuning sensitivity over a range of variable frequency while outputting a desired frequency without a change, is provided.

Thus, in the PLL circuit of the second embodiment, the above-described control method can be used to change the frequency tuning sensitivity without changing the output frequency even after the PLL circuit is locked, thereby providing an appropriate frequency tuning sensitivity.

Although the frequency divider 304 is used in the second embodiment, the present invention is not limited to this. A mixer may be used, or alternatively, a frequency divider and a mixer may be used.

(Third Embodiment)

Figure 8:
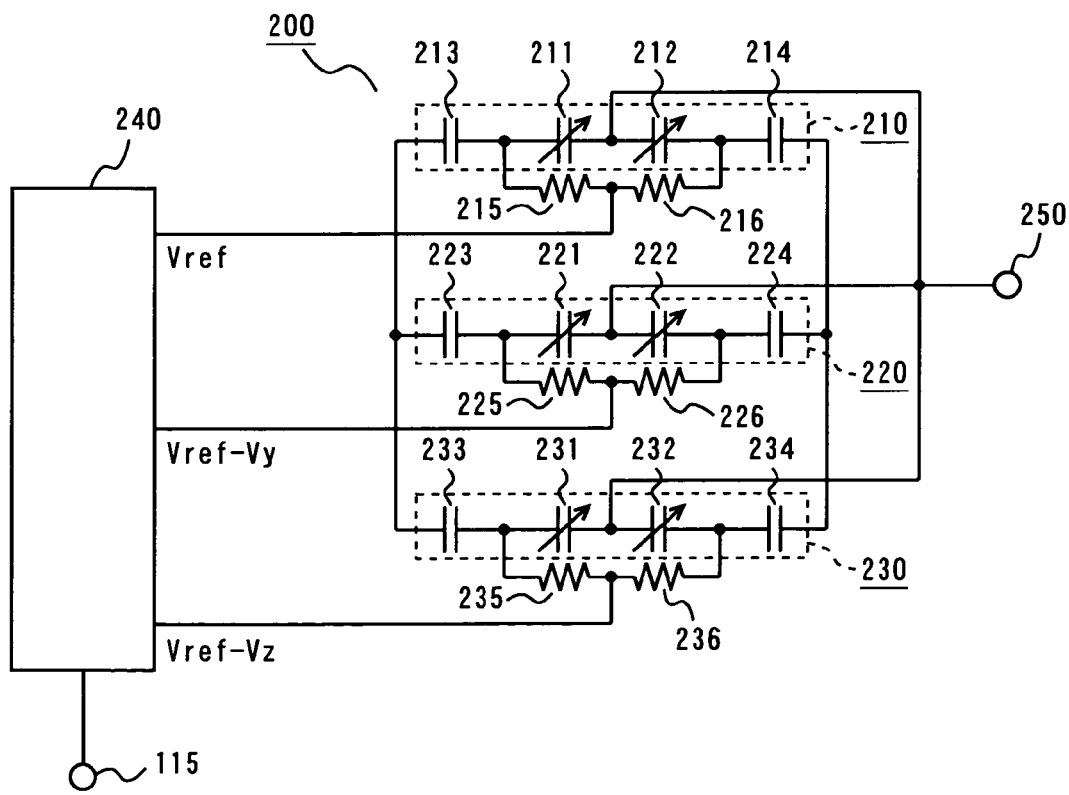
FIG. 8 is a circuit diagram illustrating a structure of a variable capacitance circuit used in a voltage controlled oscillator according to a third embodiment of the present invention.

FIG. 8 is a circuit diagram illustrating a structure of a variable capacitance circuit used in a voltage controlled oscillator according to a third embodiment of the present invention. The variable capacitance circuit 200 of FIG. 8 is used as the variable capacitance circuit 130 of the voltage controlled oscillator 100 of FIG. 1.

The frequency tuning sensitivity of a voltage controlled oscillator is substantially determined based on characteristics of a variable capacitance element used therein. Therefore, the variable capacitance element preferably has characteristics such that a capacitance thereof is moderately changed over a wide control voltage range. Actually, when the voltage controlled oscillator is implemented on a semiconductor substrate, it is difficult to use a variable capacitance element having a high level of linearity.

In the voltage controlled oscillator of the first embodiment, the frequency tuning sensitivity is approximated as being linear. However, as described above, the frequency tuning sensitivity may not be approximated as being linear, depending on the variable capacitance element used in the voltage controlled oscillator. The voltage controlled oscillator of the third embodiment can obtain substantially the same frequency tuning sensitivity in the vicinity of a desired frequency for all bands even when a variable capacitance element having a low level of linearity is used.

In FIG. 8, the variable capacitance circuit 200 includes a variable capacitance circuit 210 (hereinafter referred to as a the variable capacitance circuit X), a variable capacitance circuit 220 (hereinafter referred to as a variable capacitance circuit Y), a variable capacitance circuit 230 (hereinafter referred to as a variable capacitance circuit Z), high frequency blocking resistances 215, 216, 225, 226, 235, 236, a reference voltage control section 240, a control voltage terminal 250, and a control voltage terminal 115. The control voltage terminal 115 plays the same role as that of the first embodiment. The variable capacitance circuits X, Y, Z are connected in parallel.

The variable capacitance circuit X has variable capacitance elements 211, 212 and DC blocking capacitive elements 213, 214. The variable capacitance elements 211, 212 are connected in series. The DC blocking capacitive elements 213, 214 are connected in series to opposite ends of a series circuit of the variable capacitance elements 211, 212 so as to block a direct current component. The variable capacitance circuit X is composed of a series circuit in which the DC blocking capacitive element 213, the variable capacitance element 211, the variable capacitance element 212, and the DC blocking capacitive element 214 are successively connected together.

The variable capacitance circuit Y has variable capacitance elements 221, 222 and DC blocking capacitive elements 223, 224. The variable capacitance elements 221, 222 are connected in series. The DC blocking capacitive elements 223, 224 are connected in series to opposite ends of a series circuit of the variable capacitance elements 221, 222 so as to block a direct current component. The variable capacitance circuit Y is composed of a series circuit in which the DC blocking capacitive element 223, the variable capacitance element 221, the variable capacitance element 222, and the DC blocking capacitive element 224 are successively connected together.

The variable capacitance circuit Z has variable capacitance elements 231, 232 and DC blocking capacitive elements 233, 234. The variable capacitance elements 231, 232 are connected in series. The DC blocking capacitive elements 233, 234 are connected in series to opposite ends of a series circuit of the variable capacitance elements 231, 232 so as to block a direct current component. The variable capacitance circuit Z is composed of a series circuit in which the DC blocking capacitive element 233, the variable capacitance element 231, the variable capacitance element 232, and the DC blocking capacitive element 234 are successively connected together.

The variable capacitance elements 211, 212, 221, 222, 231, 232 are, for example, variable capacitance elements which utilize a gate capacitance which is used in a CMOS process.

The control voltage terminal 250 is connected to a connection point of the variable capacitance elements 211, 212 in the variable capacitance circuit X, a connection point of the variable capacitance elements 221, 222 in the variable capacitance circuit Y, and a connection point of the variable capacitance elements 231, 232 in the variable capacitance circuit Z.

A connection point of the variable capacitance element 211 and the DC blocking capacitive element 213 and a connection point of the variable capacitance element 212 and the DC blocking capacitive element 214 in the variable capacitance circuit X are connected via the high frequency blocking resistances 215, 216, respectively, to a first output of the reference voltage control section 240.

A connection point of the variable capacitance element 221 and the DC blocking capacitive element 223 and a connection point of the variable capacitance element 222 and the DC blocking capacitive element 224 in the variable capacitance circuit Y are connected via the high frequency blocking resistances 225, 226, respectively, to a second output of the reference voltage control section 240.

A connection point of the variable capacitance element 231 and the DC blocking capacitive element 233 and a connection point of the variable capacitance element 232 and the DC blocking capacitive element 234 in the variable capacitance circuit Z are connected via the high frequency blocking resistances 235, 236, respectively, to a third output of the reference voltage control section 240. Also, the control voltage terminal 115 is connected to an input terminal of the reference voltage control section 240.

Hereinafter, an operation of the voltage controlled oscillator of the third embodiment of the present invention will be described.

When a variable capacitance element having a low level of linearity is used, the linearity can be improved and the frequency tuning sensitivity can be averaged by a method disclosed in, for example, Koji Takinami et al., "A WIDE TUNING RANGE LC-VCO FOR 5 GHZ WIRELESS LAN USING A TUNING SENSITIVITY LINEARIZATION TECHNIQUE", 2003 Asia-Pacific Microwave Conference; and Japanese Patent Laid-Open Publication No. 2004-147310.

Figure 9A:
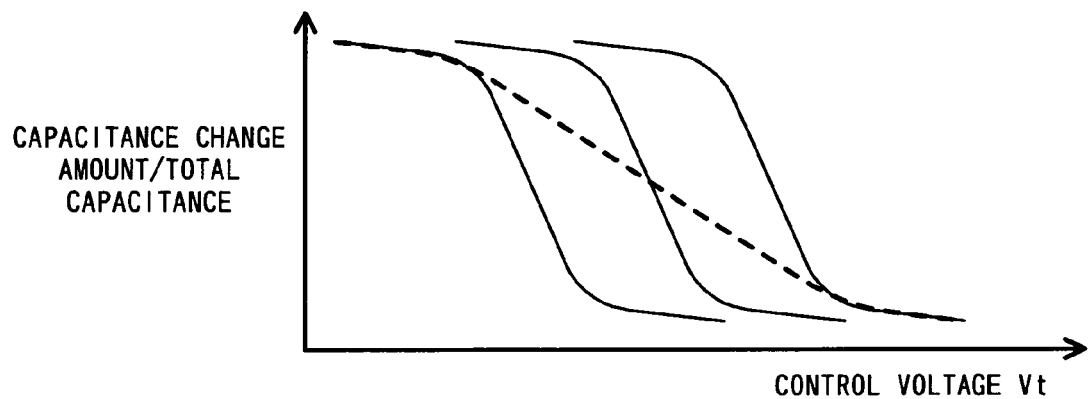
FIG. 9A is a diagram for explaining a problem with conventional schemes.
Figure 9B:
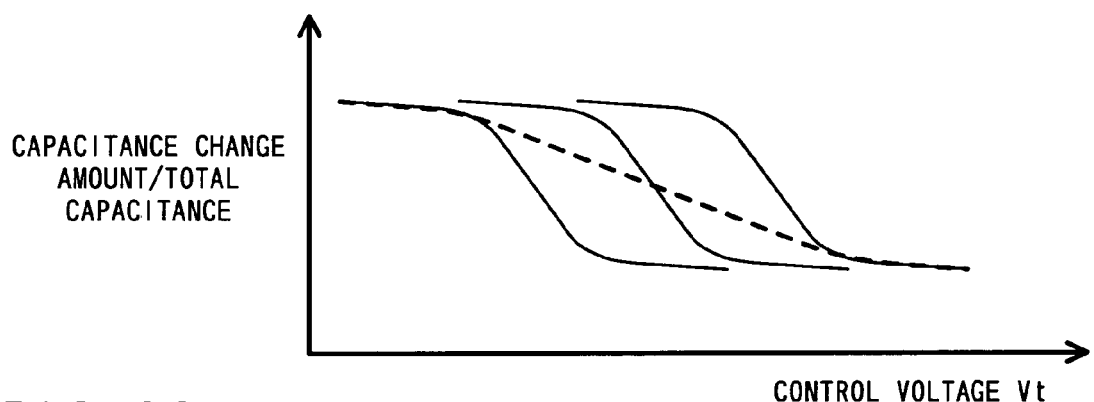
FIG. 9B is a diagram for explaining a problem with conventional schemes.
Figure 9C:
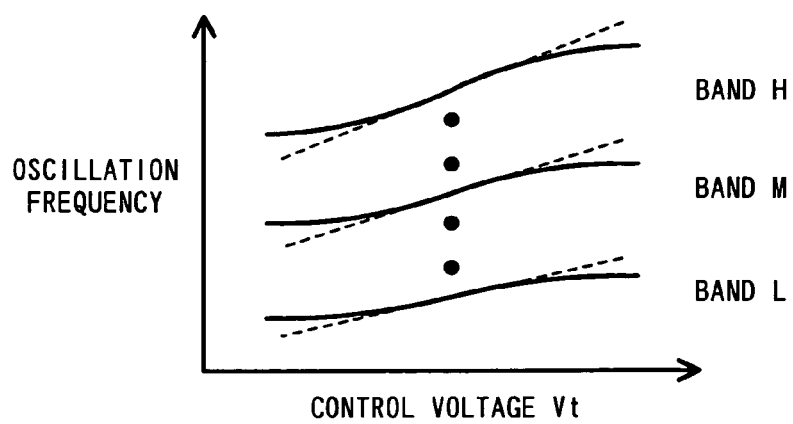
FIG. 9C is a diagram for explaining a problem with conventional schemes.

FIGS. 9A and 9B are diagrams for explaining problems with conventional techniques. As illustrated in FIGS. 9A and 9B, the frequency tuning sensitivity can be averaged in conventional 57, techniques, however, it is not possible to obtain substantially the same frequency tuning sensitivity for a plurality of bands. FIG. 9A illustrates variable capacitance characteristics for a band having a highest oscillation frequency (a band H). FIG. 9B illustrates variable capacitance characteristics for a band having a lowest oscillation frequency (a band L). In FIGS. 9A and 9B, the horizontal axis represents the control voltage Vt, while the vertical axis represents a ratio of a capacitance change amount of a variable capacitance circuit to a total capacitance value of the resonant circuit. Solid lines indicate variable capacitance characteristics of a plurality of variable capacitance circuits, and a dashed line indicates a sum of the variable capacitance characteristics. In FIG. 9C, the horizontal axis represents the control voltage Vt, while the vertical axis represents an oscillation frequency. Solid lines indicate oscillation frequency characteristics, and a dashed line indicates frequency tuning sensitivity in the vicinity of a middle point of a range of the variable control voltage Vt. The reason why the frequency tuning sensitivity of FIG. 9C is obtained is that, as described above, the ratio of the capacitance change amount of the variable capacitance circuit to the total capacitance value of the resonant circuit is low for the band L compared to the band H having a high frequency as illustrated in FIGS. 9A and 9B. Thus, even when the linearity of frequency tuning sensitivity is improved, it is not possible to obtain substantially the same frequency tuning sensitivity for a plurality of bands as illustrated in FIG. 9C.

In the third embodiment, a voltage output from the reference voltage control section 240 is caused to be in synchronization with switching of the high-frequency switch circuit 110 using the control voltage Vctrl input through the control voltage terminal 115, thereby making it possible to obtain substantially the same frequency tuning sensitivity for a plurality of bands.

Voltages input from the reference voltage control section 240 to the variable capacitance circuits X, Y, Z are represented by Vref, Vref-Vy and Vref-Vz, respectively. Note that it is assumed that Vy<Vz.

It is here assumed that Vz=2×Vy. In this case, the reference voltage control section 240 outputs three reference voltages which differ from each other by the voltage Vy. The reference voltages are applied to the variable capacitance elements 211, 212 of the variable capacitance circuit X, the variable capacitance elements 221, 222 of the variable capacitance circuit Y, and the variable capacitance elements 231, 232 of the variable capacitance circuit Z, respectively.

Figure 10A:
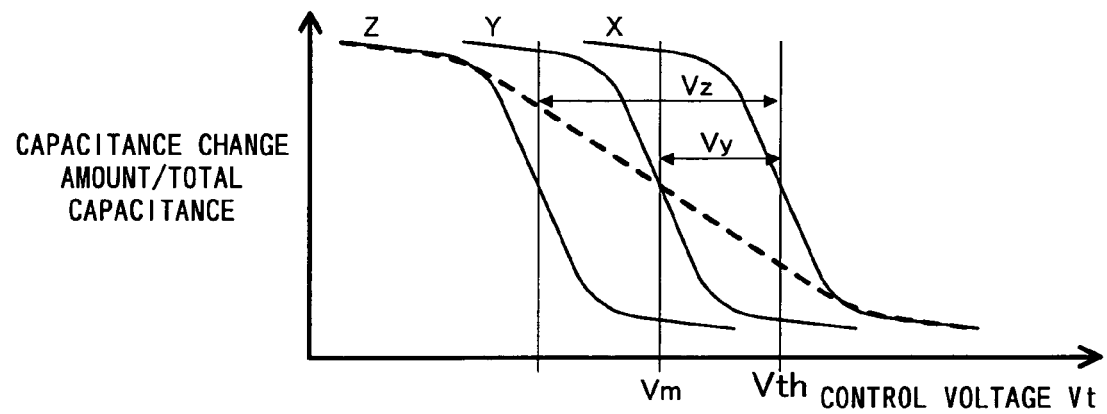
FIG. 10A is a diagram for explaining a capacitance value of a variable capacitance in the voltage controlled oscillator of the third embodiment of the present invention.
Figure 10B:
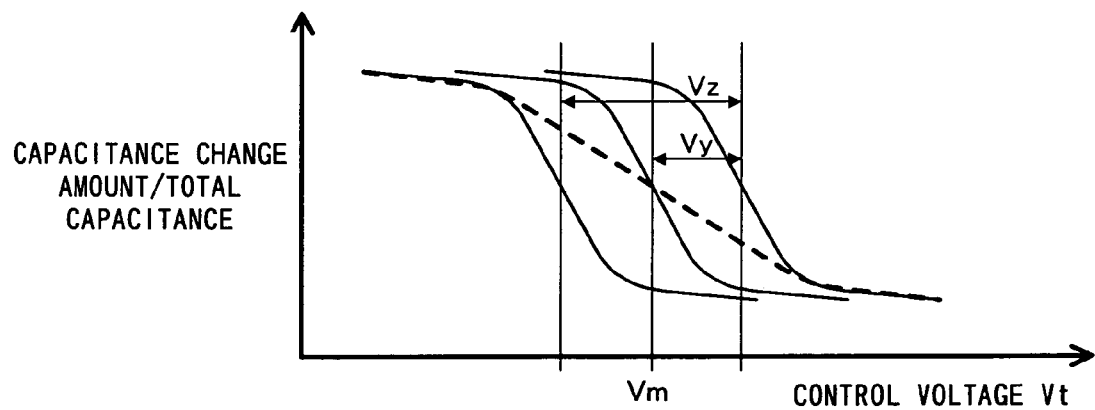
FIG. 10B is a diagram for explaining a capacitance value of a variable capacitance in the voltage controlled oscillator of the third embodiment of the present invention.
Figure 10C:
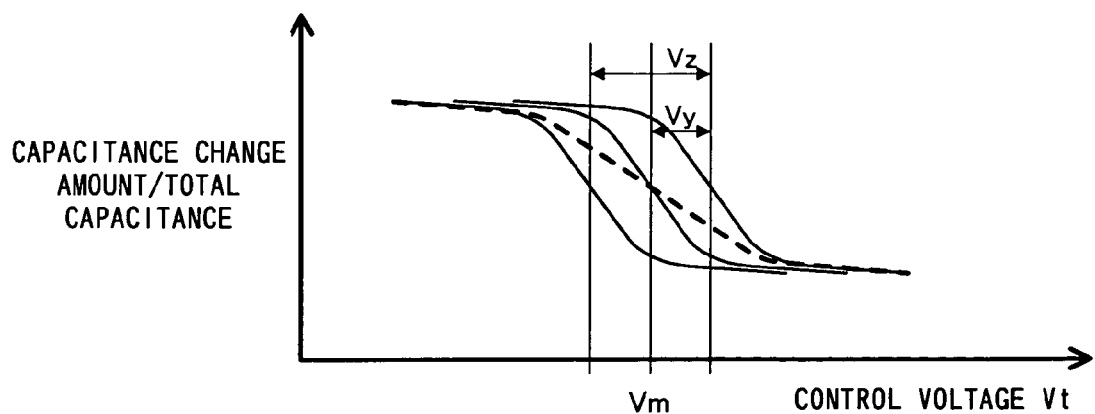
FIG. 10C is a diagram for explaining a capacitance value of a variable capacitance in the voltage controlled oscillator of the third embodiment of the present invention.

It is here assumed that the reference voltage is Vref. It is also assumed that the capacitance of each variable capacitance element is changed in the vicinity of a control voltage Vth. In this case, the capacitance values of the variable capacitance circuits X, Y, Z are changed with respect to the control voltage Vt as indicated with solid lines in FIG. 10A. In FIGS. 10A, 10B and 10C, the horizontal axis represents the control voltage Vt, while the vertical axis represents a ratio of the capacitance change amount of the variable capacitance circuit to the total capacitance value of the resonant circuit. In each figure, solid lines indicate variable capacitance characteristics of the variable capacitance circuits X, Y, Z, and a dashed line indicates the variable capacitance characteristics of the sum thereof. Therefore, the total capacitance value of the variable capacitance circuits X, Y, Z is moderately changed with respect to the control voltage Vt as indicated with the dashed line in FIG. 10A. As a result, the frequency tuning sensitivity can be averaged over a wide control voltage range.

FIG. 10A is a diagram illustrating variable capacitance characteristics for the band H which is a band having the highest oscillation frequency. FIG. 10B is a diagram illustrating variable capacitance characteristics for the band M which is a band having an intermediate oscillation frequency. FIG. 10C is a diagram illustrating variable capacitance characteristics for the band L which is a band having the lowest oscillation frequency. Frequency tuning sensitivities of the bands H, M and L of FIGS. 10A, 10B and 10C are represented by Kh, Km and Kl, respectively.

For the band H which is a band having the highest oscillation frequency, the reference voltage control section 240 controls the voltages Vref, Vref-Vy, Vref-Vz to be output so that a change in capacitance of the variable capacitance circuit 200 with respect to the control voltage Vt is caused to be moderate, thereby linearizing the frequency tuning sensitivity Kh. For example, when the variable capacitance circuit 200 is composed of the three variable capacitance circuits X, Y, Z as illustrated in FIG. 8, the voltages output from the reference voltage control section 240 have a relationship Vref>Vref-Vy>Vref-Vz. In this case, by setting Vref-Vy, which has an intermediate value among the three voltages, to be Vm (a middle point of the range of the variable control voltage Vt), the frequency tuning sensitivity can be linearized, where Vm is a center of the range of the variable control voltage Vt.

For the band L which is a band having the lowest oscillation frequency, the reference voltage control section 240 causes the frequency tuning sensitivity Kl to be substantially the same as the frequency tuning sensitivity Kh for the band H, where Vm is a center of the range of the variable control voltage Vt. The ratio of the capacitance change amount of the variable capacitance circuit to the total capacitance value of the resonant circuit for the band L is smaller than for the band H as illustrated in FIG. 9C. Therefore, for example, as illustrated in FIG. 10C, the voltage Vref-Vy is set to be the same value as that for the band H and Vy and Vz are set to be smaller than those for the band H. In other words, regions in which the capacitances of the variable capacitance circuits X, Y, Z are steeply changed are gathered in the vicinity of Vref-Vy as compared to the band H. As a result, the frequency tuning sensitivity is increased in the vicinity of Vref-Vy, i.e., in the vicinity of Vm which is the center of the range of the variable control voltage Vt, but not over the entire control voltage Vt, thereby making it possible to obtain substantially the same frequency tuning sensitivity as that of the band H.

For the band M which is a band having an intermediate oscillation frequency, the reference voltage control section 240 causes the frequency tuning sensitivity Km to be substantially the same as the frequency tuning sensitivity Kh of the band H, where Vm is a center of the range of the variable control voltage Vt, in a manner similar to that of the band L. The ratio of the capacitance change amount of the variable capacitance circuit to the total capacitance value of the resonant circuit for the band M has an intermediate value between those of the bands H, L as illustrated in FIG. 9C. Therefore, for example, as illustrated in FIG. 10B, the voltage Vm (Vref-Vy) is set to be the same value as that of the band H, while Vy and Vz are set to be intermediate between those of the bands H, L. As a result, the frequency tuning sensitivity is increased in a range which is narrower than that of the band H and broader than that of the band L in the vicinity of Vref-Vy, i.e., in the vicinity of Vm which is the center of the range of the variable control voltage Vt, but not over the entire control voltage Vt, thereby making it possible to obtain substantially the same frequency tuning sensitivity as that of the band H.

Figure 11:
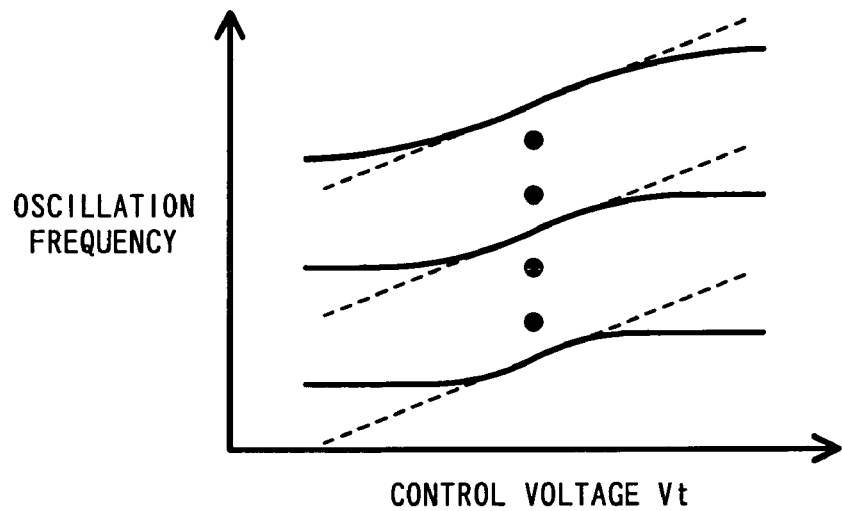
FIG. 11 is a graph illustrating an oscillation frequency of the voltage controlled oscillator of the third embodiment of the present invention.

Thus, as illustrated in FIG. 11, the reference voltage control section 240 moderately changes the capacitance of the variable capacitance element with respect to the control voltage Vt and averages the frequency tuning sensitivity Kh over a wide control voltage range for the band H having the highest oscillation frequency. For a band having a lower oscillation frequency, the reference voltage control section 240 controls Vref, Vy, Vz to be output so that the frequency tuning sensitivity is substantially the same as the frequency tuning sensitivity Kh of the highest band in the vicinity of Vm, but is not averaged the frequency tuning sensitivity.

In order to achieve a series of operations described above, the reference voltage control section 240 determines values of Vref, Vref-Vy and Vref-Vz to be output therefrom, depending on the control voltage Vctrl input through the control voltage terminal 115 of the high-frequency switch circuit 110. The determination may be performed by the reference voltage control section 240 referencing a previously stored table in which the control voltage Vctrl is associated with Vref, Vref-Vy and Vref-Vz. Specifically, when bands are switched, the reference voltage control section 240 may specify a band to be used based on the control voltage Vctrl input through the control voltage terminal 115. The reference voltage control section 240 may also adjust and output Vref, Vref-Vy and Vref-Vz, which are to be applied to the variable capacitance circuit, in synchronization with the high-frequency switch circuit 110 so that the frequency tuning sensitivity has a desired value when bands are switched. As a result, it is possible to obtain substantially the same frequency tuning sensitivity for all bands. Thus, phase noise can be suppressed by achieving substantially the same frequency tuning sensitivity for all bands. This is because if the frequency tuning sensitivity is high, an influence of phase noise deterioration due to a noise component carried in Vt is significant.

In the third embodiment, when the variable capacitance circuit 200 is composed of the three variable capacitance circuits X, Y, Z, Vref-Vy which has an intermediate value among the voltages output from the reference voltage control section 240 is set to be the middle point Vm of the control voltage Vt. However, Vref-Vy is not necessarily limited to Vm, and may be any arbitrary voltage. Also in this case, an effect similar to that described above is obtained. For example, as indicated in the second embodiment, when the voltage controlled oscillator 100 employing the variable capacitance circuit 200 is used in the PLL circuit 300, the control voltage Vt which is input to the voltage controlled oscillator 100 when the PLL circuit 300 is locked may be detected and the detected control voltage Vt may be defined as Vref-Vy. In this case, it is possible to obtain substantially the same frequency tuning sensitivity for all bands, where a frequency when the PLL circuit 300 is locked is a center. As a result, even after the PLL circuit 300 is locked, the frequency tuning sensitivity can be changed to an appropriate value without changing the output frequency.

In the third embodiment, the variable capacitance circuit 200 is composed of the three variable capacitance circuits X, Y, Z connected in parallel. However, the number of variable capacitance circuits connected in parallel is not limited to three, and may be two, or four or more. In other words, the number of variable capacitance circuits may be n (n: a natural number of 2 or more). In this case, the frequency tuning sensitivity control section may control voltages of variable capacitance elements of n variable capacitance circuits in synchronization with a switching control voltage input to a switching control terminal of a high-frequency switch circuit. For any n, an effect similar to that described above is obtained.

In the third embodiment, the reference voltage control section 240 adjusts Vref, Vref-Vy and Vref-Vz based on the control voltage Vctrl input through the control voltage terminal 115. However, Vref, Vref-Vy and Vref-Vz may not be necessarily adjusted based on the control voltage Vctrl. For example, the reference voltage control section 240 may determine a band which will provide a desired frequency by itself, output the control voltage Vctrl to the control voltage terminal 115, and based on the determined band, adjust Vref, Vref-Vy and Vref-Vz so that substantially the same frequency tuning sensitivity is obtained. Also in this case, an effect similar to that described above is obtained.

In the third embodiment, the reference voltage control section 240 outputs the potential differences Vref, Vref-Vy and Vref-Vz, where Vz=2×Vy and the difference between each potential is constantly Vy. However, a different potential difference may be provided. Also in this case, an effect similar to that described above is obtained.

In the voltage controlled oscillator of the third embodiment, the PLL circuit of the second embodiment may be employed. Also in this case, an effect similar to that described above is obtained.

Now, a preferable example of the reference voltage used when n variable capacitance circuits are provided will be described. When n is an odd number, the reference voltage control section may use an $(n+1)/2$-th reference voltage as a voltage which is the middle point of the range of the variable control voltage Vt. When n is an even number, the reference voltage control section may use an intermediate voltage between an $n/2$-th reference voltage and an $(n+2)/2$-th reference voltage as a voltage which is the middle point of the range of the variable control voltage Vt. Thereby, substantially the same frequency tuning sensitivity can be achieved for all bands, where an intermediate voltage of the control voltage Vt is a center.

When n is an odd number, the reference voltage control section may use the $(n+1)/2$-th reference voltage as the control voltage Vt when the oscillation frequency is locked by feedback-controlling the oscillation frequency. When n is an even number, the reference voltage control section may use an intermediate voltage between the $n/2$-th reference voltage and the $(n+2)/2$-th reference voltage as the control voltage Vt when the oscillation frequency is locked by feedback-controlling the oscillation frequency. As a result, even when the PLL circuit is already locked, a frequency output from the PLL circuit is not changed before and after that, so that a desired frequency is output without a change.

Note that when all of the switching elements of the m high-frequency switch circuits are OFF, the reference voltage control section may adjust the reference voltage so that the change rate of the oscillation frequency with respect to the control voltage Vt is substantially constant over the control voltage Vt. In states other than when all of the switching elements of the m high-frequency switch circuits are OFF, the reference voltage control section adjusts the (n+1)/2-th reference voltage so that the change rate of the oscillation frequency with respect to the control voltage is substantially the same as when all of the switching elements are OFF in the vicinity of the reference voltage Vt or an intermediate voltage when the PLL circuit is locked, where n variable capacitance circuits are provided (n is an odd number). Also, in a similar state, when n is an even number, the reference voltage control section adjusts an intermediate voltage between the n/2-th reference voltage and the (n+2)/2-th reference voltage so that the change rate of the oscillation frequency with respect to the control voltage is substantially the same as when all of the switching elements are OFF in the vicinity of the reference voltage Vt or an intermediate voltage. For example, the reference voltage control section previously determines a reference voltage, depending on a band to be used, and outputs the previously determined reference voltage, so that the change rate of the oscillation frequency with respect to the control voltage is substantially the same as when all of the switching elements are OFF. As a result, the range of the control voltage in which the frequency tuning sensitivity is averaged can be maximized.

When n variable capacitance circuits are arranged in order of a reference voltage to be input thereto (largest first), a difference between a reference voltage to be input to the variable capacitance element of the k-th variable capacitance circuit (k is a natural number of 2 or more and n or less) and a reference voltage to be input to the variable capacitance element of the (k−1)-th variable capacitance circuit is maximum when all of the switching elements of the m high-frequency switch circuits are OFF and minimum when all of the switching elements of the m high-frequency switch circuits are ON. The difference may have an intermediate value between the maximum and minimum values in states other than when all of the switching elements of the m high-frequency switch circuits are ON or OFF. As a result, the ranges of Vref, Vref-Vy and Vref-Vz output from the reference voltage control section 240 are limited, and therefore, can be easily controlled.

(Fourth Embodiment)

Figure 12:
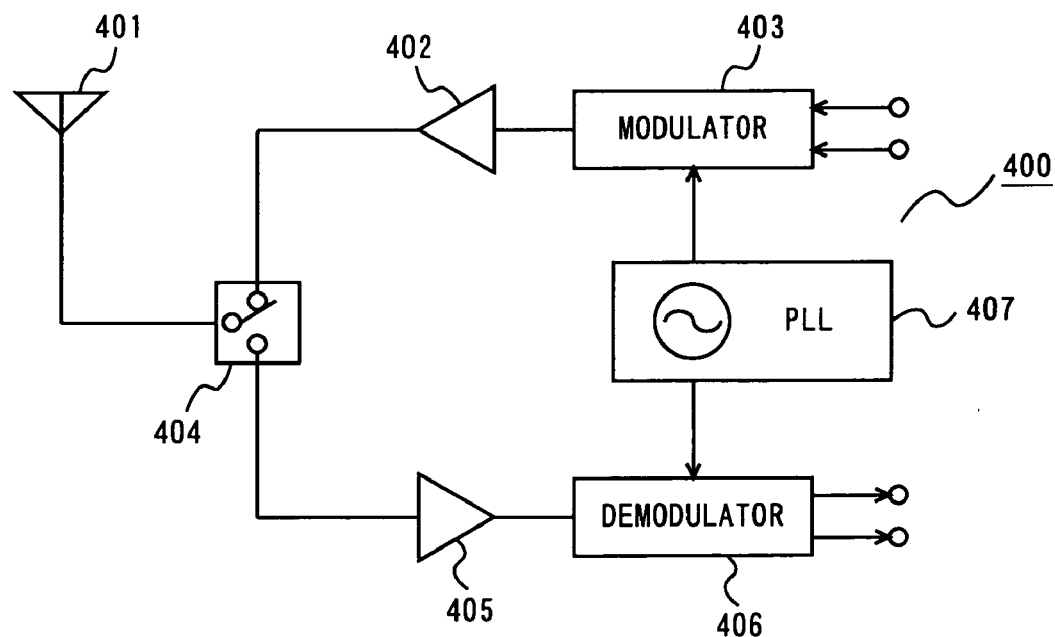
FIG. 12 is a block diagram illustrating a structure of a wireless communication apparatus 400 employing a voltage controlled oscillator according to any one of the first to third embodiments of the present invention.
Figure 13:
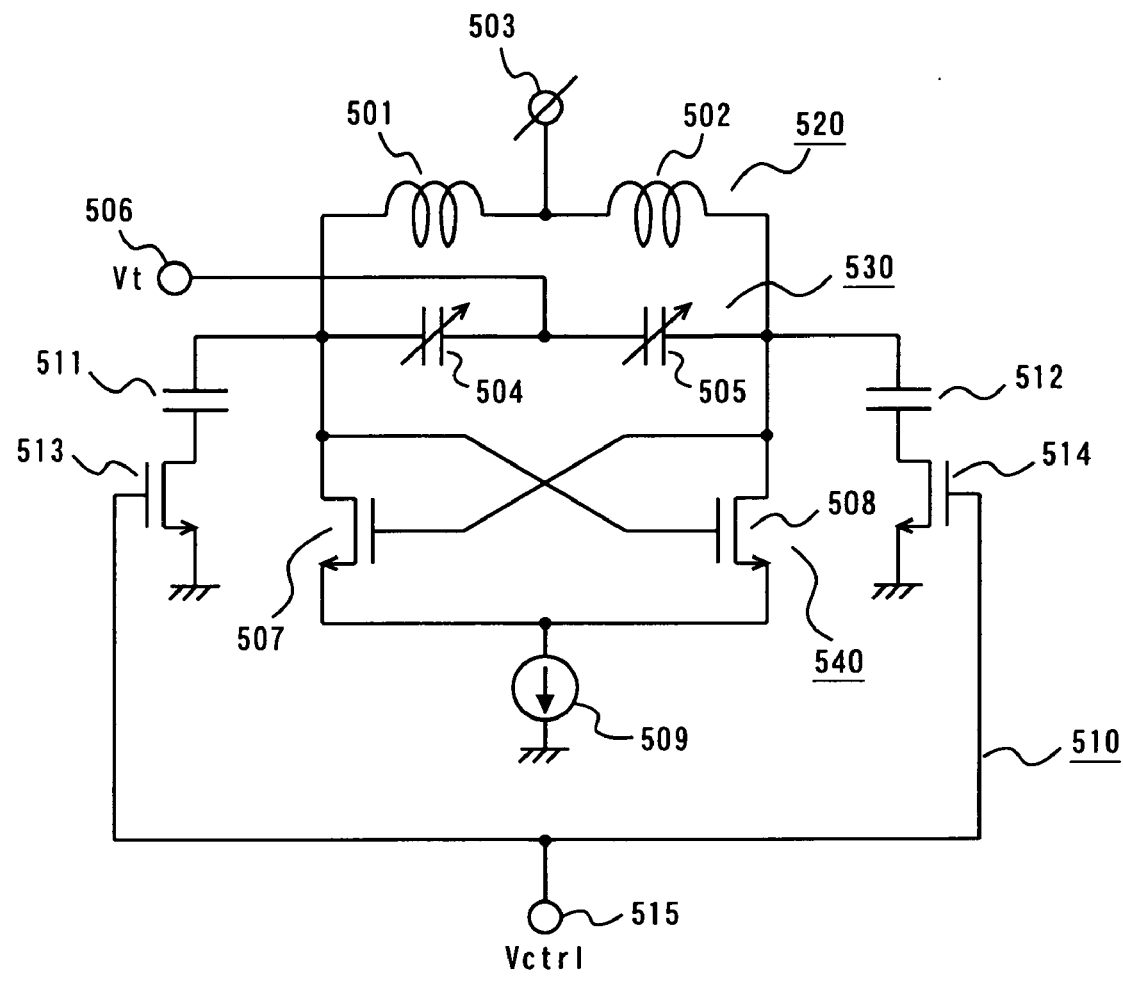
FIG. 13 is a diagram illustrating an exemplary structure of a conventional voltage controlled oscillator 500 having a band switching function.
Figure 14A:
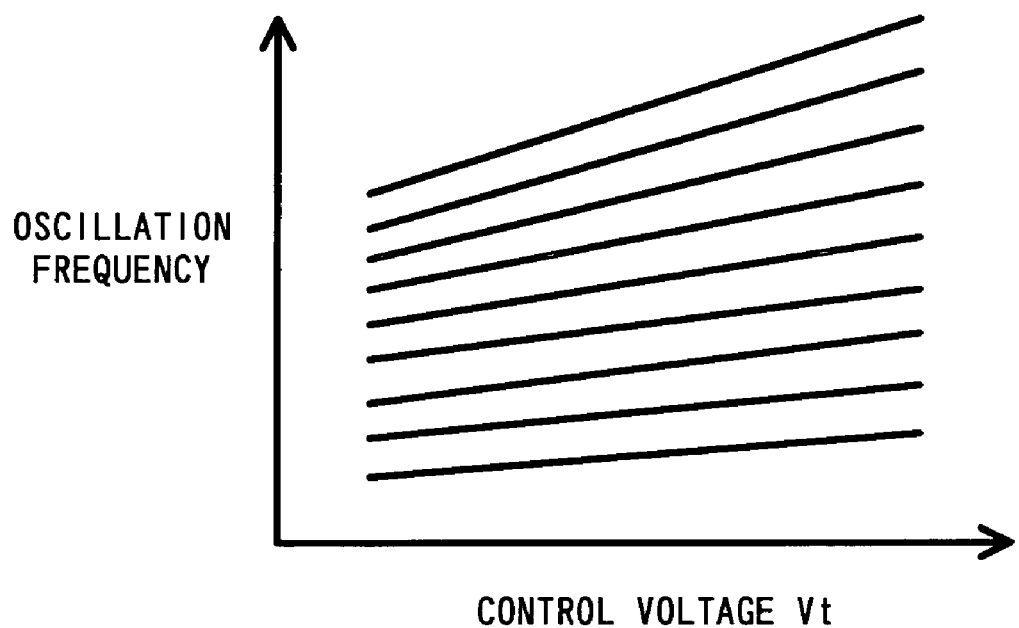
FIG. 14A is a diagram illustrating how an oscillation frequency is shifted in conventional voltage controlled oscillators.
Figure 14B:
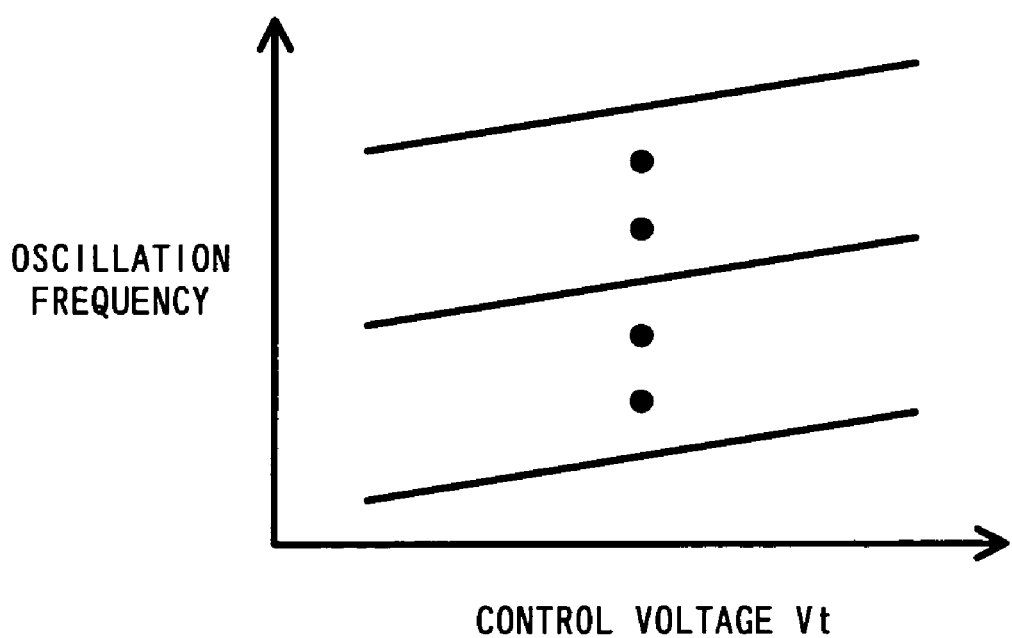
FIG. 14B is a diagram illustrating characteristics of a voltage controlled oscillator 600 when substantially the same frequency tuning sensitivity is obtained over an entire oscillation frequency range.
Figure 15:
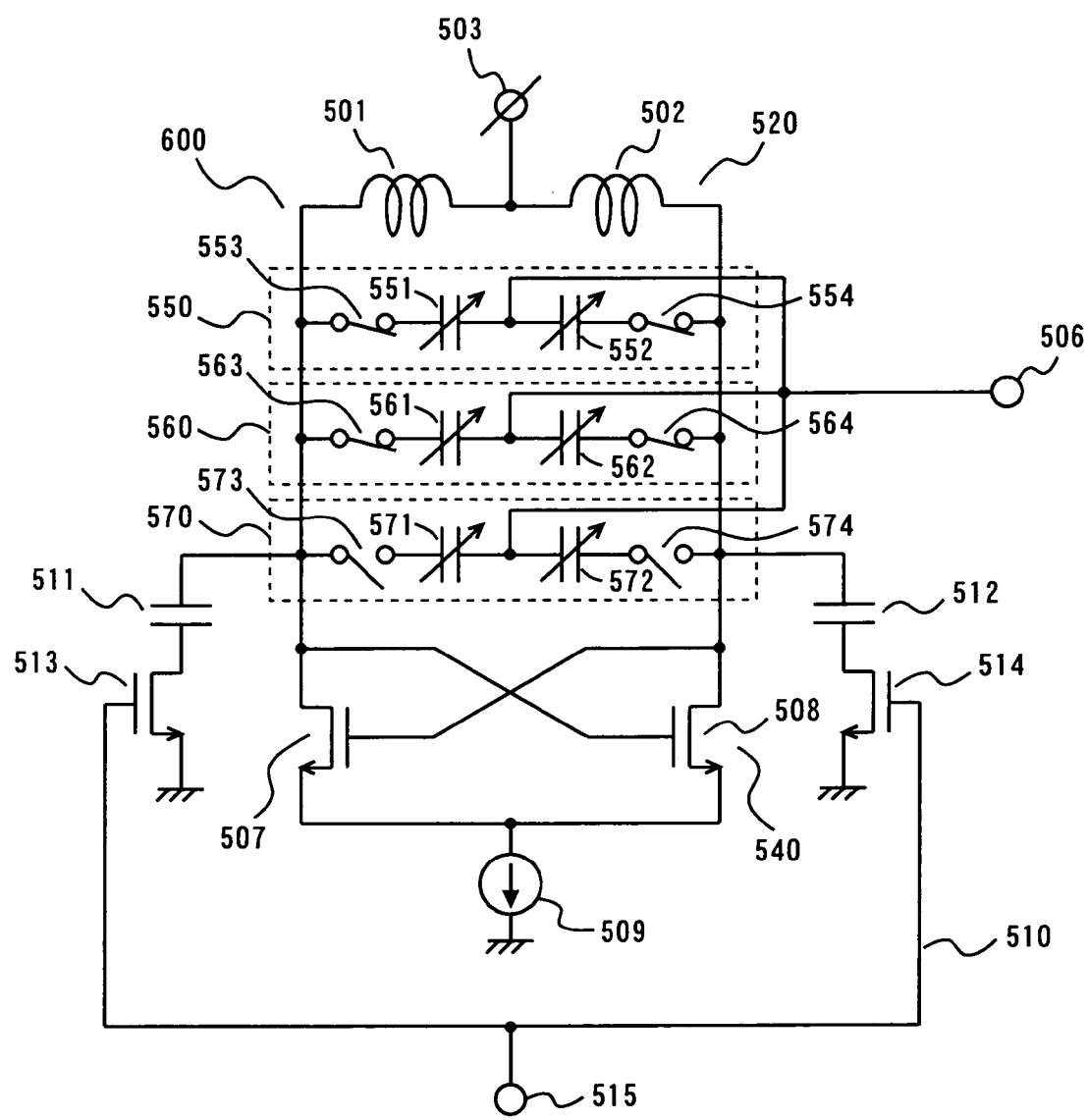
FIG. 15 is a circuit diagram illustrating the conventional voltage controlled oscillator 600 which employs an improved method of obtaining substantially the same frequency tuning sensitivity over a wide range of variable frequency.
Figure 16A:
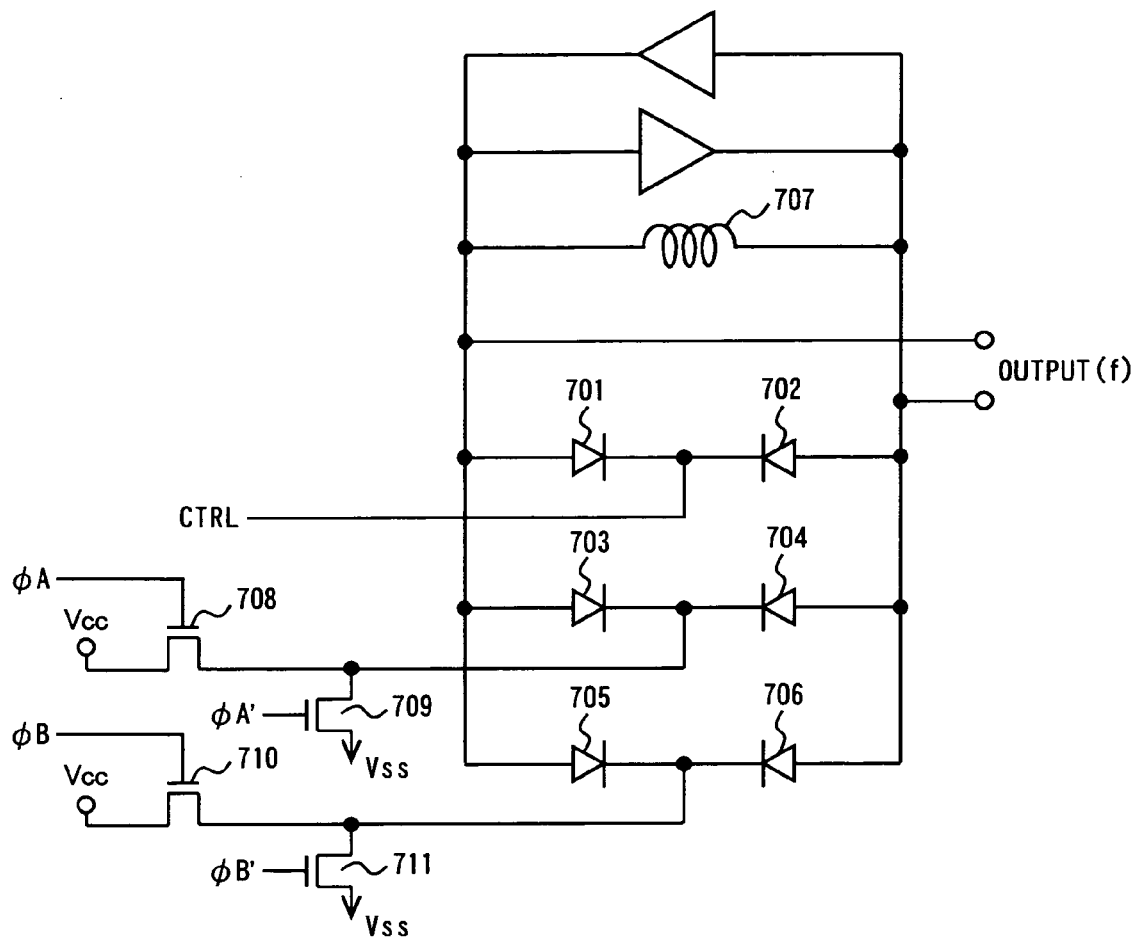
FIG. 16A is a circuit diagram illustrating a conventional voltage controlled oscillator 700.
Figure 16B:
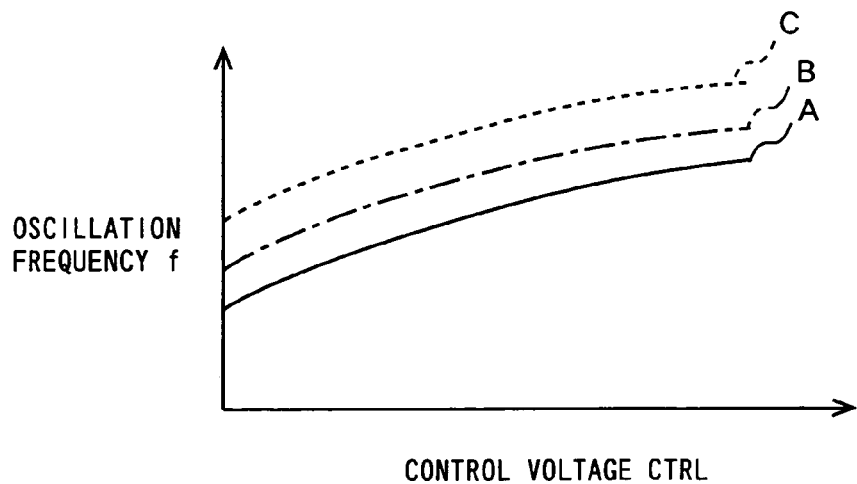
FIG. 16B is a graph illustrating characteristics of the conventional voltage controlled oscillator 700.

FIG. 12 is a block diagram illustrating a structure of a wireless communication apparatus 400 employing a voltage controlled oscillator according to any one of the first to third embodiments of the present invention.

In FIG. 12, the wireless communication apparatus 400 comprises an antenna 401, a power amplifier 402, a modulator 403, a switch 404, a low noise amplifier 405, a demodulator 406, and a PLL circuit 407.

The PLL circuit 407 is the PLL circuit of the second embodiment employing the first or third voltage controlled oscillator.

In the wireless communication apparatus 400, when a radio signal is transmitted, the modulator 403 modulates a desired high-frequency signal output from the PLL circuit 407 using a base band modulation signal. The high frequency modulated signal output from the modulator 403 is amplified by the power amplifier 402 and is emitted via the switch 404 from the antenna 401.

When a radio signal is received, the high frequency modulated signal received from the antenna 401 is input via the switch 404 to the low noise amplifier 405 and is amplified, and the resultant signal is input to the demodulator 406. The demodulator 406 demodulates the input high frequency modulated signal to a base band modulation signal using a high-frequency signal output from the PLL circuit 407.

As illustrated in FIG. 12, the PLL circuit 407 including the voltage controlled oscillator is an essential circuit as means for generating a high-frequency signal.

In the fourth embodiment, the wireless communication apparatus 400 has the structure of FIG. 12. The present invention is not limited to this. For example, different PLL circuits may be used for transmission and reception, respectively. Alternatively, a plurality of PLL circuits may be used for each of transmission and reception. In addition, the PLL circuit may also function as a modulator.

In the first to fourth embodiments, each variable capacitance element utilizes a gate capacitance which is used in a CMOS process. Each variable capacitance element may be of other types. Also, in this case, an effect similar to that described above is obtained.

In the first to fourth embodiments, an MOS transistor is used as the oscillation transistor. Alternatively, a bipolar transistor may be used.

As described above, according to the present invention, when a plurality of bands are used so as to obtain a wide range of variable frequency, it is possible to provide a voltage controlled oscillator which has satisfactory phase noise characteristics and substantially the same frequency tuning sensitivity for all bands. The present invention also provides a PLL circuit and a wireless communication apparatus using the same.

The voltage controlled oscillator of the present invention, and a PLL circuit and a wireless communication apparatus using the same have satisfactory phase noise characteristics and can control a frequency range over a wide band, and therefore, are useful in the fields of wireless communication and the like.

While the invention has been described in detail, the foregoing description is in all aspects illustrative and not restrictive. It is understood that numerous other modifications and variations can be devised without departing from the scope of the invention.

What is claimed is:

1. A voltage controlled oscillator composed of a differential circuit for oscillating a high-frequency signal, comprising:

an inductor circuit having an inductor;

n (n is a natural number of 2 or more) variable capacitance circuits connected in parallel with the inductor circuit, each having a variable capacitance element whose capacitance value is changed, depending on a control voltage applied, so as to feedback control an oscillation frequency;

m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input;

a negative resistance circuit connected in parallel with the inductor circuit;

a frequency control section of controlling ON/OFF of the switching elements of the m high-frequency switch circuits to shift a band of the oscillation frequency; and a frequency tuning sensitivity control section of adjusting a change rate of a total capacitance of the n variable capacitance circuits with respect to the control voltage, depending on the band to be used, wherein the frequency tuning sensitivity control section is connected to virtual ground points of differential signals of the n variable capacitance circuits.

2. The voltage controlled oscillator according to claim 1, wherein the frequency control section inputs the switching control voltage for controlling ON/OFF of the switching element, depending on the band to be used, to the switching control terminal of the high-frequency switch circuit, and the frequency tuning sensitivity control section selectively switches a predetermined reference voltage and the control voltage in synchronization with the switching control voltage so that the selected predetermined reference voltage or control voltage is used as a voltage to be applied to one end of each variable capacitance element of the n variable capacitance circuits.

3. The voltage controlled oscillator according to claim 2, wherein the frequency tuning sensitivity control section includes n frequency tuning sensitivity control switching elements, and the frequency tuning sensitivity control switching elements are connected to the respective virtual ground points of the n variable capacitance circuits and are selectively switched to determine whether the voltages to be applied to the respective variable capacitance circuits are the predetermined reference voltage or the control voltage.

4. The voltage controlled oscillator according to claim 2, wherein the frequency tuning sensitivity control section includes n−1 frequency tuning sensitivity control switching elements, the frequency tuning sensitivity control switching elements are connected to the respective virtual ground points of the n−1 variable capacitance circuits and are selectively switched to determine whether the voltages to be applied to the respective variable capacitance circuits are the predetermined reference voltage or the control voltage, and the control voltage is supplied to a virtual ground point of the remaining one of the variable capacitance circuits.

5. The voltage controlled oscillator according to claim 3, wherein the reference voltage is a voltage at a middle point of a range in which the control voltage varies.

6. The voltage controlled oscillator according to claim 4, wherein the reference voltage is a voltage at a middle point of a range in which the control voltage varies.

7. The voltage controlled oscillator according to claim 3, wherein the reference voltage has a value of the control voltage when the oscillation frequency is feedback-controlled so that the oscillation frequency is locked.

8. The voltage controlled oscillator according to claim 4, wherein the reference voltage has a value of the control voltage when the oscillation frequency is feedback-controlled so that the oscillation frequency is locked.

9. The voltage controlled oscillator according to claim 3, wherein, when all of the switching elements of the m high-frequency switch circuits are OFF, the frequency tuning sensitivity control section controls the frequency tuning sensitivity control switching element so that the control voltage is applied to only one of the n variable capacitance circuits and the reference voltage is applied to the remaining n−1 variable capacitance circuits.

10. The voltage controlled oscillator according to claim 4, wherein, when all of the switching elements of the m high-frequency switch circuits are OFF, the frequency tuning sensitivity control section controls the frequency tuning sensitivity control switching element so that the control voltage is applied to only one of the n variable capacitance circuits and the reference voltage is applied to the remaining n−1 variable capacitance circuits.

11. The voltage controlled oscillator according to claim 3, wherein, when all of the switching elements of the m high-frequency switch circuits are ON, the frequency tuning sensitivity control section controls the frequency tuning sensitivity control switching element so that the control voltage is applied to all of the n variable capacitance circuits.

12. The voltage controlled oscillator according to claim 4, wherein, when all of the switching elements of the m high-frequency switch circuits are ON, the frequency tuning sensitivity control section controls the frequency tuning sensitivity control switching element so that the control voltage is applied to all of the n variable capacitance circuits.

13. The voltage controlled oscillator according to claim 1, wherein the frequency tuning sensitivity control section previously determines whether each of the variable capacitance circuits is used as a variable capacitance or a fixed capacitance for each of the bands to be shifted by the frequency control section, and inputs the control signal to the variable capacitance circuit used as the variable capacitance, and a predetermined reference voltage to the variable capacitance circuit used as the fixed capacitance.

14. The voltage controlled oscillator according to claim 13, wherein the voltage controlled oscillator is provided in a PLL circuit, and a control voltage when the PLL circuit is locked is used as the predetermined reference voltage.

15. A voltage controlled oscillator composed of a differential circuit for oscillating a high-frequency signal, comprising:

an inductor circuit having an inductor;

n (n is a natural number of 2 or more) variable capacitance circuits connected in parallel with the inductor circuit, each having a variable capacitance element, wherein a blocking capacitor for blocking a direct current component is provided on opposite ends of each of the n variable capacitance circuits;

m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input;

a negative resistance circuit connected in parallel with the inductor circuit;

a frequency control section of controlling ON/OFF of the switching elements of the m high-frequency switch circuits to shift a band of the oscillation frequency;

a control terminal of inputting a control voltage for feedback-controlling an oscillation frequency to one terminals of the variable capacitance elements of the n variable capacitance circuits; and a reference voltage control section of inputting reference voltages to the other terminals of the variable capacitance elements of the n variable capacitance circuits, adjusting the reference voltages, depending on the band to be used, and adjusting a rate of a change in the oscillation frequency with respect to the control voltage.

16. The voltage controlled oscillator according to claim 15, wherein the reference voltage control section controls the reference voltages to be input to the other terminals of the variable capacitance elements of the n variable capacitance circuits in synchronization with the switching control voltage input to the switching control terminal of the high-frequency switch circuit.

17. The voltage controlled oscillator according to claim 16, wherein the reference voltage control section uses the (n+1)/2-th reference voltage of the reference voltages input to the other terminals of the variable capacitance elements of the n variable capacitance circuits as a voltage at a middle point of a range within which the control voltage varies when n is an odd number, and uses an intermediate voltage between the n/2-th reference voltage and the (n+2)/2-th reference voltage as the voltage at the middle point of the range within which the control voltage varies when n is an even number.

18. The voltage controlled oscillator according to claim 16, wherein, when n is an odd number, the reference voltage control section uses the (n+1)/2-th reference voltage of the reference voltages input to the other terminals of the variable capacitance elements of the n variable capacitance circuits as a control voltage obtained when the oscillation frequency is locked by feedback-controlling the oscillation frequency; and when n is an even number, uses an intermediate voltage between the n/2-th reference voltage and the (n+2)/2-th reference voltage as the control voltage obtained when the oscillation frequency is locked by feedback-controlling the oscillation frequency.

19. The voltage controlled oscillator according to claim 16, wherein, when all of the switching elements of the m high-frequency switch circuit are OFF, the reference voltage control section adjusts the reference voltage so that a rate of a change in the oscillation frequency with respect to the control voltage is substantially constant over the control voltage, and
in states other than when all of the switching elements of the m high-frequency switch circuits are OFF, the reference voltage control section adjusts the (n+1)/2-th reference voltage when n is an odd number and an intermediate voltage between the n/2-th reference voltage and the (n+2)/2-th reference voltage when n in an odd number, in the n variable capacitance circuits.

20. The voltage controlled oscillator according to claim 16, wherein, when the n variable capacitance circuits are arranged in order of the reference voltage to be input thereto, the largest first, a difference between the reference voltage to be input to the variable capacitance element of the k-th variable capacitance circuit (k is a natural number of 2 or more and n or less) and the reference voltage to be input to the variable capacitance element of the (k−1)-th variable capacitance circuit is:
maximum when all of the switching elements of the m high-frequency switch circuits are OFF;
minimum when all of the switching elements of the m high-frequency switch circuits are ON; and
an intermediate value between the maximum and minimum values in states other than when all of the switching elements of the m high-frequency switch circuits are ON or OFF.

21. A PLL circuit comprising a voltage controlled oscillator composed of a differential circuit for oscillating a high-frequency signal, wherein
the voltage controlled oscillator comprises:
an inductor circuit having an inductor;
n (n is a natural number of 2 or more) variable capacitance circuits connected in parallel with the inductor circuit, each having a variable capacitance element whose capacitance value is changed, depending on a control voltage applied, so as to feedback control an oscillation frequency;
m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input;
a negative resistance circuit connected in parallel with the inductor circuit;
a frequency control section of controlling ON/OFF of the switching elements of the m high-frequency switch circuits to shift a band of the oscillation frequency; and
a frequency tuning sensitivity control section of adjusting a change rate of a total capacitance of the n variable capacitance circuits with respect to the control voltage, depending on the band to be used,
wherein the frequency tuning sensitivity control section is connected to virtual ground points of differential signals of the n variable capacitance circuits.

22. A PLL circuit comprising a voltage controlled oscillator composed of a differential circuit for oscillating a high-frequency signal, wherein
the voltage controlled oscillator comprises:
an inductor circuit having an inductor;
n (n is a natural number of 2 or more) variable capacitance circuits connected in parallel with the inductor circuit, each having a variable capacitance element, wherein a blocking capacitor for blocking a direct current component is provided on opposite ends of each of the n variable capacitance circuits;
m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input;
a negative resistance circuit connected in parallel with the inductor circuit;
a frequency control section of controlling ON/OFF of the switching elements of the m high-frequency switch circuits to shift a band of the oscillation frequency;
a control terminal of inputting a control voltage for feedback-controlling an oscillation frequency to one terminals of the variable capacitance elements of the n variable capacitance circuits; and
a reference voltage control section of inputting reference voltages to the other terminals of the variable capacitance elements of the n variable capacitance circuits, adjusting the reference voltages, depending on the band to be used, and adjusting a rate of a change in the oscillation frequency with respect to the control voltage.

23. A PLL circuit for fixing an oscillation frequency, comprising:
a voltage controlled oscillator composed of a differential circuit for oscillating a high-frequency signal high-frequency signal, and adjusting an oscillation frequency, depending on a control voltage; and a feedback control voltage adjustment circuit of feeding back the high-frequency signal output by the voltage controlled oscillator, comparing a phase difference between the high-frequency signal and a reference signal, and adjusting the control voltage to be input to the voltage controlled oscillator, wherein the voltage controlled oscillator comprises:

an inductor circuit having an inductor;

n (n is a natural number of 2 or more) variable capacitance circuits connected in parallel with the inductor circuit, each having a variable capacitance element whose capacitance value is changed, depending on a control voltage applied, so as to feedback control an oscillation frequency;

m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input;

a negative resistance circuit connected in parallel with the inductor circuit;

a frequency control section of controlling ON/OFF of the switching elements of the m high-frequency switch circuits to shift a band of the oscillation frequency; and a frequency tuning sensitivity control section connected to virtual ground points of the n variable capacitance circuits, and selectively switching a predetermined reference voltage and the control voltage as a voltage to be input to one terminal of each of the variable capacitance elements of the n variable capacitance circuits, depending on a shift of the oscillation frequency by ON/OFF of the switching elements of the m high-frequency switch circuit, wherein the frequency tuning sensitivity control section uses as the reference voltage the control voltage output from the feedback control voltage adjustment circuit.

24. A wireless communication apparatus comprising a voltage controlled oscillator composed of a differential circuit for oscillating a high-frequency signal, wherein the voltage controlled oscillator comprises:

an inductor circuit having an inductor;

n (n is a natural number of 2 or more) variable capacitance circuits connected in parallel with the inductor circuit, each having a variable capacitance element whose capacitance value is changed, depending on a control voltage applied, so as to feedback control an oscillation frequency;

m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input;

a negative resistance circuit connected in parallel with the inductor circuit;

a frequency control section of controlling ON/OFF of the switching elements of the m high-frequency switch circuits to shift a band of the oscillation frequency; and a frequency tuning sensitivity control section of adjusting a change rate of a total capacitance of the n variable capacitance circuits with respect to the control voltage, depending on the band to be used, wherein the frequency tuning sensitivity control section is connected to virtual ground points of differential signals of the n variable capacitance circuits.

25. A wireless communication apparatus comprising a voltage controlled oscillator composed of a differential circuit for oscillating a high-frequency signal, wherein the voltage controlled oscillator comprises:

an inductor circuit having an inductor;

n (n is a natural number of 2 or more) variable capacitance circuits connected in parallel with the inductor circuit, each having a variable capacitance element, wherein a blocking capacitor for blocking a direct current component is provided on opposite ends of each of the n variable capacitance circuits;

m (m is a natural number of 1 or more) high-frequency switch circuits connected in parallel with the inductor circuit, each having a capacitive element, a switching element connected to the capacitive element, and a switching control terminal through which a switching control voltage for controlling ON/OF of the switching element is input;

a negative resistance circuit connected in parallel with the inductor circuit;

a frequency control section of controlling ON/OFF of the switching elements of the m high-frequency switch circuits to shift a band of the oscillation frequency;

a control terminal of inputting a control voltage for feedback-controlling an oscillation frequency to one terminals of the variable capacitance elements of the n variable capacitance circuits; and a reference voltage control section of inputting reference voltages to the other terminals of the variable capacitance elements of the n variable capacitance circuits, adjusting the reference voltages, depending on the band to be used, and adjusting a rate of a change in the oscillation frequency with respect to the control voltage.

* * * * *

UNITED STATES PATENT AND TRADEMARK OFFICE
CERTIFICATE OF CORRECTION

PATENT NO. : 7,170,358 B2
APPLICATION NO. : 11/150151
DATED : January 30, 2007
INVENTOR(S) : Takayuki Tsukizawa et al.

It is certified that error appears in the above-identified patent and that said Letters Patent is hereby corrected as shown below:

<u>Column 28</u>
Line 66, "ON/OF" should read --ON/OFF--.

<u>Column 30</u>
Line 52, "ON/OF" should read --ON/OFF--.

<u>Column 32</u>
Line 15, "ON/OF" should read --ON/OFF--.
Line 46, "ON/OF" should read --ON/OFF--.

<u>Column 32 to Column 33</u>
In column 32, line 67 to column 33, line 1, "oscillating a high-frequency signal high-frequency signal," should read --oscillating a high-frequency signal,--.

<u>Column 33</u>
Line 23, "ON/OF" should read --ON/OFF--.

<u>Column 34</u>
Line 4, "ON/OF" should read --ON/OFF--.
Line 35, "ON/OF" should read --ON/OFF--.

Signed and Sealed this

Twenty-ninth Day of May, 2007

JON W. DUDAS
*Director of the United States Patent and Trademark Office*